(12) United States Patent
Huemoeller et al.

(10) Patent No.: US 7,951,697 B1
(45) Date of Patent: May 31, 2011

(54) EMBEDDED DIE METAL ETCH STOP FABRICATION METHOD AND STRUCTURE

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 165 days.

(21) Appl. No.: 11/765,828

(22) Filed: Jun. 20, 2007

(51) Int. Cl.
*H01L 21/44* (2006.01)
(52) U.S. Cl. ........................................ 438/597; 438/584
(58) Field of Classification Search .......... 257/678–733; 438/584, 597
See application file for complete search history.

(56) References Cited

U.S. PATENT DOCUMENTS

| | | | |
|---|---|---|---|
| 3,698,821 A | 10/1972 | Ekstrand | |
| 4,194,127 A | 3/1980 | Schmidt | |
| 4,776,022 A | 10/1988 | Fox et al. | |
| 5,108,541 A | 4/1992 | Schneider et al. | |
| 5,116,459 A | 5/1992 | Kordus et al. | |
| 5,181,445 A | 1/1993 | Cothrell | |
| 5,232,505 A | 8/1993 | Novak et al. | |
| 5,338,900 A | 8/1994 | Schneider et al. | |
| 5,369,431 A | 11/1994 | Levy et al. | |
| 5,506,793 A | 4/1996 | Straayer et al. | |
| 5,517,234 A | 5/1996 | Gerber et al. | |
| 5,784,484 A | 7/1998 | Umezawa | |
| 5,946,569 A | 8/1999 | Huang | |
| 6,021,380 A | 2/2000 | Fredriksen et al. | |
| 6,035,527 A | 3/2000 | Tamm | |
| 6,091,075 A | 7/2000 | Shibata et al. | |
| 6,194,250 B1 | 2/2001 | Melton et al. | |
| 6,303,423 B1 | 10/2001 | Lin | |
| 6,462,107 B1 | 10/2002 | Sinclair et al. | |
| 6,476,388 B1 | 11/2002 | Nakagaki et al. | |
| 6,603,877 B1 | 8/2003 | Bishop | |
| 6,730,857 B2 | 5/2004 | Konrad et al. | |
| 6,740,964 B2 | 5/2004 | Sasaki | |
| 6,869,870 B2 | 3/2005 | Lin | |
| 6,872,591 B1 | 3/2005 | Wang et al. | |
| 6,919,514 B2 | 7/2005 | Konrad et al. | |
| 7,242,081 B1 | 7/2007 | Lee | |
| 7,335,571 B2 * | 2/2008 | Rumsey et al. | 438/401 |
| 7,345,361 B2 | 3/2008 | Mallik et al. | |
| 7,372,151 B1 | 5/2008 | Fan et al. | |
| 7,384,864 B2 | 6/2008 | Lin | |
| 7,396,756 B2 | 7/2008 | Lin | |
| 7,420,276 B2 | 9/2008 | Lin et al. | |
| 7,553,738 B2 | 6/2009 | Min et al. | |
| 7,714,996 B2 | 5/2010 | Yan et al. | |

(Continued)

OTHER PUBLICATIONS

Berry et al., "Thin Stacked Interposer Package", U.S. Appl. No. 11/865,617, filed Oct. 1, 2007.

(Continued)

*Primary Examiner* — Thanh V Pham
*Assistant Examiner* — Marvin Payen
(74) *Attorney, Agent, or Firm* — Gunnison, McKay & Hodgson, L.L.P.; Serge J. Hodgson

(57) ABSTRACT

A method of forming an electronic component package includes forming a patterned dielectric layer comprising circuit pattern artifacts and at least one electronic component opening. An etch stop metal protected circuit pattern is plated with the circuit pattern artifacts. An electronic component is mounted in the electronic component opening. The etch stop metal protected circuit pattern provide an etch stop for substrate formation etch processes. In this manner, etching of a patterned conductor layer is avoided insuring that impedance is controlled to within tight tolerance.

15 Claims, 21 Drawing Sheets

U.S. PATENT DOCUMENTS

| | | | |
|---|---|---|---|
| 7,741,698 B2 | 6/2010 | Chinthakindi et al. | |
| 7,763,954 B2 | 7/2010 | Chinthakindi et al. | |
| 2001/0017694 A1 | 8/2001 | Oomori et al. | |
| 2003/0076666 A1 | 4/2003 | Daeche et al. | |
| 2004/0021201 A1 | 2/2004 | Ballantine et al. | |
| 2004/0043551 A1 | 3/2004 | Beroz | |
| 2004/0104417 A1 | 6/2004 | Song et al. | |
| 2004/0120570 A1 | 6/2004 | Levi et al. | |
| 2004/0183094 A1 | 9/2004 | Caletka et al. | |
| 2004/0239918 A1 | 12/2004 | Sugihara et al. | |
| 2005/0116337 A1* | 6/2005 | Chua et al. | 257/723 |
| 2005/0194533 A1 | 9/2005 | Okuda et al. | |
| 2006/0124874 A1 | 6/2006 | Uto et al. | |
| 2007/0206267 A1 | 9/2007 | Tung et al. | |
| 2007/0273014 A1* | 11/2007 | Lee et al. | 257/686 |
| 2007/0273049 A1 | 11/2007 | Khan et al. | |
| 2007/0290376 A1 | 12/2007 | Zhao et al. | |
| 2008/0003414 A1* | 1/2008 | Magera et al. | 428/209 |
| 2008/0122079 A1* | 5/2008 | Chen et al. | 257/737 |
| 2008/0136041 A1 | 6/2008 | Kotake et al. | |
| 2008/0225283 A1 | 9/2008 | Chi et al. | |
| 2008/0230887 A1 | 9/2008 | Sun et al. | |
| 2009/0229856 A1 | 9/2009 | Fredenberg et al. | |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", 58$^{th}$ *ECTC Proceedings*, May 2008, Lake Buena Vista, FL, 6 pages, IEEE.

Huemoeller et al., U.S. Appl. No. 11/765,806, filed Jun. 20, 2007, entitled "Metal ETCH Stop Fabrication Method and Structure".

Karim et al., "Embedded Passive Component Network Substrate and Fabrication Method", U.S. Appl. No. 11/924,156, filed Oct. 25, 2007.

\* cited by examiner

EMBEDDED DIE METAL ETCH STOP FABRICATION METHOD AND STRUCTURE

BACKGROUND OF THE INVENTION

1. Field of the Invention

The present invention relates generally to substrates for mounting of electronic components and the resulting packages. More particularly, the present invention relates to a method of fabricating an embedded circuit pattern and the resulting structure.

2. Description of the Related Art

To form a circuit pattern, features in a dielectric layer are filled with plated copper. To prevent the formation of dimples in the plated copper as well as to ensure that the features are completely filled, an over-plate process is typically used.

During this over-plate process, the features are overfilled with plated copper such that the copper not only fills the features but also is plated with a significant thickness across the entire substrate.

The over-plate process is followed by an over-etch process. During this over-etch process, the excess plated copper is removed by etching. Further, to ensure that all of the excess plated copper is removed and to avoid shorts within the circuit pattern, the plated copper is over etched such that the circuit pattern is recessed into the dielectric layer.

Although the over-plate process and over-etch process are effective in producing a circuit pattern, the over-etch process is difficult to accurately control. Thus, the amount to which the circuit pattern is etched during the over-etch process varies from batch to batch. Accordingly, circuit pattern impedance as well as other electrical characteristics varies from batch to batch, which is generally undesirable.

SUMMARY OF THE INVENTION

In accordance with one embodiment, a method of fabricating a substrate includes patterning a photoresist layer on a first carrier to form a patterned photoresist layer, the patterned photoresist layer including circuit pattern artifacts. A first patterned etch stop layer is plated on the first carrier and within the circuit pattern artifacts and a first patterned conductor layer is plated on the first patterned etch stop layer.

By using the first carrier as the electroplating electrode for plating of the first patterned etch stop layer and the first patterned conductor layer, an electroless plating operation and associated desmear process are avoided. This simplifies manufacturing and reducing fabrication cost as compared to using an electroless plating operation.

Further, by using the first carrier as the electroplating electrode, relatively large circuit pattern artifacts are reliably plated.

In one embodiment, an automatic optical inspection (AOI) is performed to inspect the substrate and the various features formed therein for defects. The automatic optical inspection is performed on a single layer, allowing rework of the substrate to correct any defects found. Further, in the event that the defect requires scrapping of the substrate, the substrate is a relatively low cost single layer substrate compared to a multilayer substrate. In either event, performing the automatic optical inspection on a single layer maximizes yield and minimizes fabrication cost.

The first patterned etch stop layer and the first patterned conductor layer are laminated by a dielectric material to a second patterned etch stop layer and a second patterned conductor layer supported by a second carrier.

The first carrier and second carrier are removed using a carrier etch process. As the etch stop metal of the first and second patterned etch stop layers is selectively etchable compared to a conductor metal of the first and second patterned conductor layers as well as the first and second carriers, the first and second patterned etch stop layers provide an etch stop for the carrier etch process. In this manner, etching of the first and second patterned conductor layers during the carrier etch process is avoided.

The method further includes forming via apertures between the first patterned conductor layer and the second patterned conductor layer. Electrically conductive vias are formed in the via apertures by forming a via conductor layer using an over-plate process to form the via conductor layer and removing the via conductor layer except within the via apertures using a via conductor layer etch process.

The first patterned etch stop layer and the second patterned etch stop layer provide an etch stop for the via conductor layer etch process. In this manner, etching of the first and second patterned conductor layers during the via conductor layer etch process is avoided.

By preventing the patterned conductor layers from being etched during the removal of the carriers and the removal of the over-plated via conductor layer, the height and width, i.e., cross-sectional area, of the patterned conductor layers is guaranteed thus insuring that impedance is controlled to within tight tolerance.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
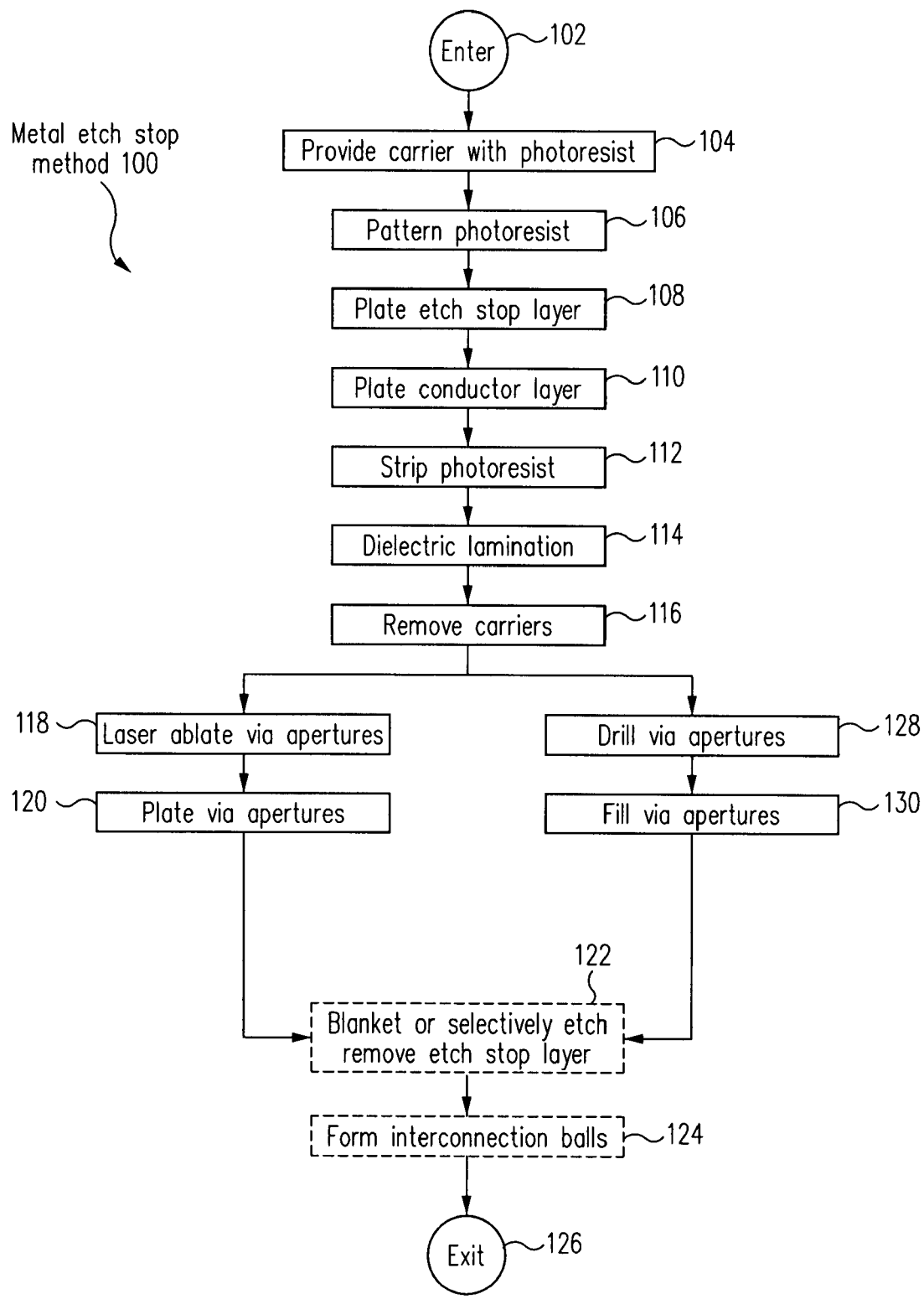
FIG. 1 is a metal etch stop method for fabricating an electronic component substrate in accordance with one embodiment of the present invention.
Figure 2:
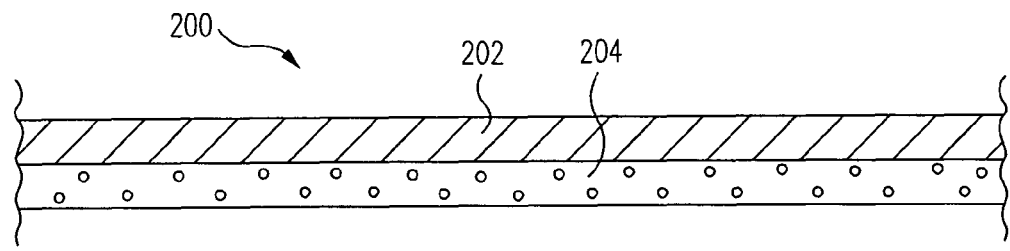
FIG. 2 is a cross-sectional view of a substrate during fabrication in accordance with one embodiment.

FIG. 1 is a metal etch stop method 100 for fabricating an electronic component substrate in accordance with one embodiment of the present invention. FIG. 2 is a cross-sectional view of a substrate 200 during fabrication in accordance with one embodiment. FIGS. 3, 4, 5, 6, 7, 8, 9, 10, 11, 12, 13, 14 are cross-sectional views of substrate 200 of FIG. 2 at various stages during fabrication in accordance with various embodiments of the present invention.

Referring now to FIGS. 1 and 2 together, from an ENTER OPERATION 102, flow moves to a PROVIDE CARRIER WITH PHOTORESIST OPERATION 104. In PROVIDE CARRIER WITH PHOTORESIST OPERATION 104, substrate 200 including a carrier 202 and a photoresist layer 204 is provided.

Carrier 202 is an electrically conductive material, e.g., copper. Photoresist layer 204 is a layer of photoresist, e.g., positive or negative photoresist, on carrier 202.

Figure 3:
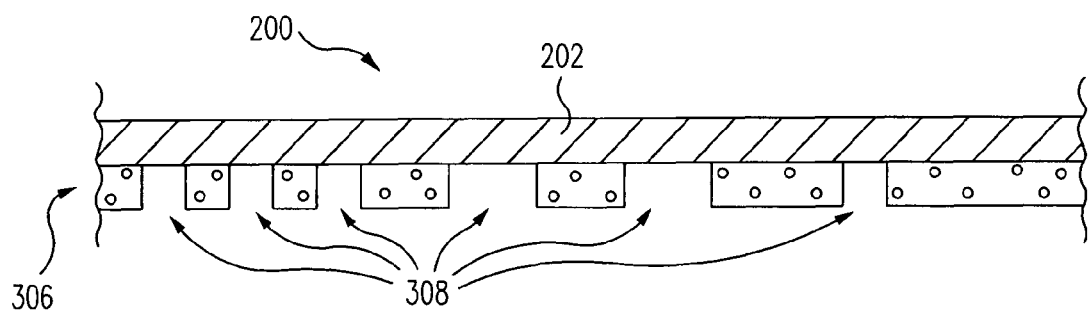
FIGS. 3, 4, 5, 6, 7, 8, 9, 10, 11, 12, 13, 14 are cross-sectional views of the substrate of FIG. 2 at various stages during fabrication in accordance with various embodiments of the present invention.

Referring now to FIGS. 1, 2 and 3 together, from PROVIDE CARRIER WITH PHOTORESIST OPERATION 104, flow moves to a PATTERN PHOTORESIST OPERATION 106. In PATTERN PHOTORESIST OPERATION 106, photoresist layer 204 of substrate 200 of FIG. 2 is patterned to form a patterned photoresist layer 306 as illustrated in FIG. 3. Photoresist layer 204 is patterned using laser-ablation in one embodiment. In another embodiment, a photolithography process is used including use of laser direct imaging.

Photoresist layer 204 is patterned to expose portions of carrier 202. More particularly, photoresist layer 204 is patterned to form circuit pattern artifacts 308, i.e., openings, within photoresist layer 204. Stated another way, patterned photoresist layer 306 includes circuit pattern artifacts 308. Carrier 202 is exposed through circuit pattern artifacts 308.

Illustratively, circuit pattern artifacts 308 include trace channels and land apertures in which traces and lands are formed as discussed below.

Figure 4:
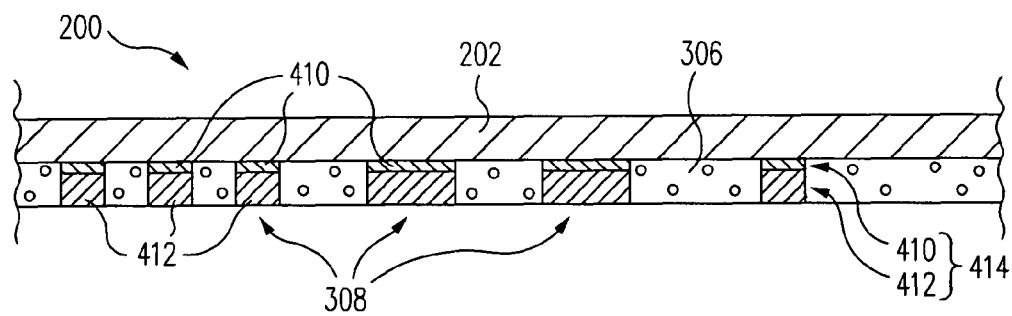

Referring now to FIGS. 1 and 4 together, from PATTERN PHOTORESIST OPERATION 106, flow moves to a PLATE ETCH STOP LAYER OPERATION 108. In PLATE ETCH STOP LAYER OPERATION 108, a patterned etch stop layer 410 of an etch stop metal is plated within circuit pattern artifacts 308 of patterned photoresist layer 306.

From PLATE ETCH STOP LAYER OPERATION 108, flow moves to a PLATE CONDUCTOR LAYER OPERATION 110. In PLATE CONDUCTOR LAYER OPERATION 110, a patterned conductor layer 412 of a conductor metal is plated on patterned etch stop layer 410 within circuit pattern artifacts 308 of patterned photoresist layer 306. Patterned conductor layer 412 defines circuit traces and/or lands in one embodiment.

The etch stop metal, e.g., nickel, tin, gold, or palladium, of patterned etch stop layer 410 is selectively etchable compared to the conductor metal, e.g., copper, silver, or solder, of patterned conductor layer 412. Patterned etch stop layer 410 and patterned conductor layer 412 thus form an etch stop metal protected circuit pattern 414 on carrier 202 and within circuit pattern artifacts 308 of patterned photoresist layer 306. Stated another way, etch stop metal protected circuit pattern 414 is a bi-layer structure including patterned etch stop layer 410 and patterned conductor layer 412.

In accordance with one embodiment, carrier 202 is used as the electrode for electroplating of patterned etch stop layer 410 and patterned conductor layer 412. Patterned etch stop layer 410 and patterned conductor layer 412 are electroplated using carrier 202 as the electrode using any one of a number of electroplating techniques well known to those of skill in the art, and the particular technique used is not essential to this embodiment.

By using carrier 202 as the electroplating electrode, an electroless plating operation and associated desmear process are avoided, thus simplifying manufacturing and reducing fabrication cost as compared to using an electroless plating operation. However, in one embodiment, patterned etch stop layer 410 and/or patterned conductor layer 412 are plated using an electroless plating operation.

Further, by using carrier 202 as the electroplating electrode, relatively large circuit pattern artifacts 308 are reliably plated.

Figure 5:
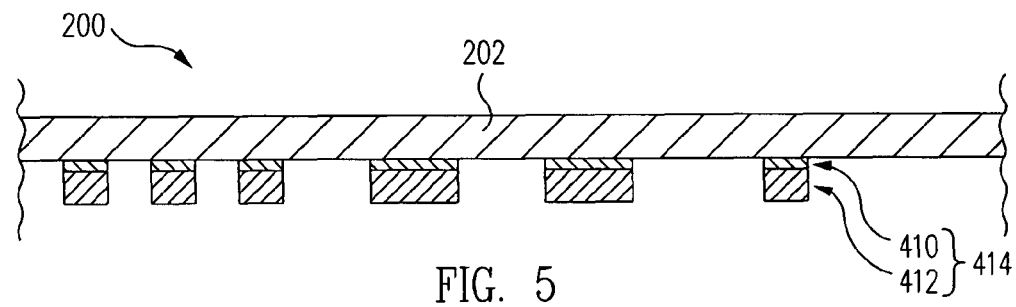

Referring now to FIGS. 1, 4 and 5 together, from PLATE CONDUCTOR LAYER OPERATION 110, flow moves to a STRIP PHOTORESIST OPERATION 112. In STRIP PHOTORESIST OPERATION 112, patterned photoresist layer 306 is stripped, i.e., removed. Patterned photoresist layer 306 is stripped using any one of a number of photoresist stripping techniques well known to those of skill in the art, the particular technique used is not essential to this embodiment.

Thus, as shown in FIG. 5, after removal of patterned photoresist layer 306, etch stop metal protected circuit pattern 414 remains on carrier 202.

In one embodiment, an automatic optical inspection (AOI) is performed after PATTERN PHOTORESIST OPERATION 106, PLATE ETCH STOP LAYER OPERATION 108, PLATE CONDUCTOR LAYER OPERATION 110, and/or STRIP PHOTORESIST OPERATION 112, or combinations thereof. An automatic optical inspection inspects substrate 200 and the various features formed therein for defects, e.g., inspects circuit pattern artifacts 308, patterned etch stop layer 410, patterned conductor layer 412 and/or etch stop metal protected circuit pattern 414 or combinations thereof for defects.

The automatic optical inspection is performed on a single layer, allowing rework of substrate 200 to correct any defects found. Further, in the event that the defect requires scrapping of substrate 200, substrate 200 is a relatively low cost single layer substrate compared to a multilayer substrate. In either event, performing the automatic optical inspection on a single layer maximizes yield and minimizes fabrication cost.

Figure 6:
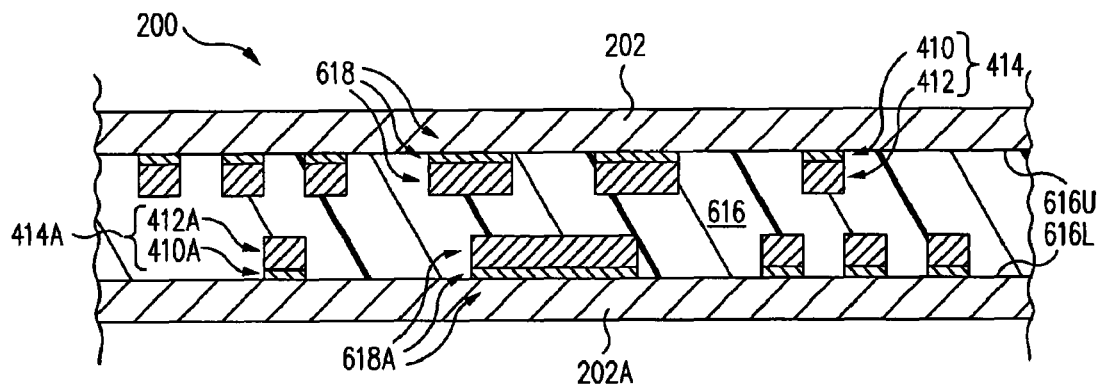

Referring now to FIGS. 1, 5 and 6 together, from STRIP PHOTORESIST OPERATION 112, flow moves to a DIELECTRIC LAMINATION OPERATION 114. In DIELECTRIC LAMINATION OPERATION 114, etch stop metal protected circuit patterns 414, 414A are laminated to a dielectric material 616.

More particularly, as shown in FIG. 6, etch stop metal protected circuit pattern 414 of FIG. 5 is laminated into an upper, e.g., first, surface 616U of dielectric material 616. A lower etch stop metal protected circuit pattern 414A is laminated into a lower, e.g., second, surface 616L of dielectric material 616.

Second etch stop metal protected circuit pattern 414A is on a carrier 202A. Second etch stop metal protected circuit pattern 414A includes a patterned etch stop layer 410A and a patterned conductor layer 412A.

Second etch stop metal protected circuit pattern 414A is formed on carrier 202A in a manner similar or identical to the formation of etch stop metal protected circuit pattern 414 on carrier 202, and so is not repeated again.

In the view of FIG. 6, etch stop metal protected circuit pattern 414A is above carrier 202A whereas etch stop metal protected circuit pattern 414 is below carrier 202 facilitating lamination of etch stop metal protected circuit patterns 414, 414A into dielectric layer 616.

Etch stop metal protected circuit pattern 414 and carrier 202 are sometimes referred to as upper, e.g., first, etch stop metal protected circuit pattern 414 and carrier 202, respectively. Etch stop metal protected circuit pattern 414 and carrier 202 form an upper, e.g., first, etch stop metal protected circuit pattern carrier structure 618.

Similarly, etch stop metal protected circuit pattern 414A and carrier 202A are sometimes referred to as lower, e.g., second, etch stop metal protected circuit pattern 414A and carrier 202A, respectively. Etch stop metal protected circuit pattern 414A and carrier 202A form a lower, e.g., second, etch stop metal protected circuit pattern carrier structure 618A.

Dielectric layer 616 is glass impregnated resin, e.g., printed circuit board material, dielectric film, epoxy, or other dielectric material. In one embodiment, dielectric layer 616 is a reinforced dielectric providing structural integrity to substrate 200.

Generally, during DIELECTRIC LAMINATION OPERATION 114, upper etch stop metal protected circuit pattern carrier structure 618 is united with lower etch stop metal protected circuit pattern carrier structure 618A by dielectric layer 616.

In accordance with one embodiment, upper etch stop metal protected circuit pattern 414 is placed on upper surface 616U of dielectric layer 616 and lower etch stop metal protected circuit pattern 414A is placed on lower surface 616L of dielectric layer 616. The assembly is heated while etch stop metal protected circuit patterns 414, 414A are pressed into dielectric layer 616. This can be accomplished by full press or tack lamination process.

Due to the heat and pressure, dielectric layer 616 is caused to flow around etch stop metal protected circuit patterns 414, 414A to carriers 202, 202A, respectively. Generally, dielectric layer 616 flows to encapsulate etch stop metal protected circuit patterns 414, 414A within dielectric layer 616 such that dielectric layer 616 contacts carriers 202, 202A in the spaces between etch stop metal protected circuit patterns 414, 414A as shown in FIG. 6.

Figure 7:
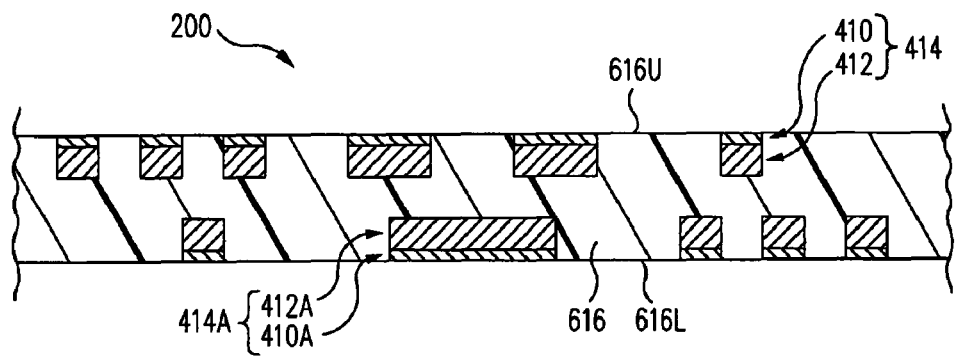

Referring now to FIGS. 1, 6 and 7 together, from DIELECTRIC LAMINATION OPERATION 114, flow moves to a REMOVE CARRIERS OPERATION 116. In REMOVE CARRIERS OPERATION 116, carriers 202, 202A are removed, e.g., using a carrier etch process or peeled. In one embodiment, carriers 202, 202A are copper and are removed using a copper etch process as the carrier etch process. During this copper etch process, patterned etch stop layers 410, 410A provide an etch stop for the copper etch process.

In one embodiment, an etch stop is an etch process end point. To illustrate, the copper etch process is performed until carriers 202, 202A are completely removed, which is the process end point. More particularly, upon complete removal of carriers 202, 202A, patterned etch stop layers 410, 410A become exposed and prevent further etching during the copper etch process.

As illustrated in FIG. 7, patterned etch stop layers 410, 410A, i.e., the exterior surfaces thereof, are substantially coplanar with upper and lower surfaces 616U, 616L of dielectric material 616, respectively.

In one embodiment, after removal of carriers 202, 202A, patterned etch stop layers 410, 410A are removed.

Figure 8:
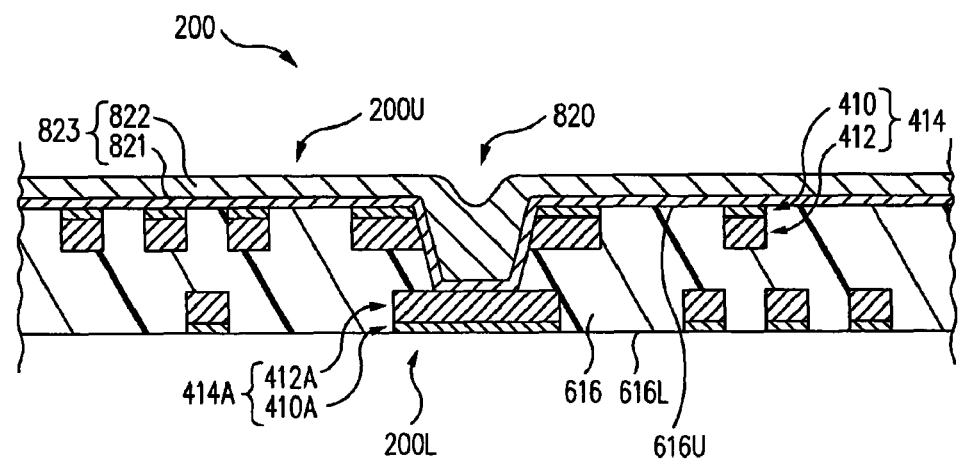

Referring now to FIGS. 1 and 8 together, from REMOVE CARRIERS OPERATION 116, flow moves to a LASER-ABLATE VIA APERTURES OPERATION 118. In LASER-ABLATE VIA APERTURES OPERATION 118, via apertures 820, sometimes called blind via apertures, are formed in substrate 200 using laser-ablation.

As illustrated FIG. 8, via apertures 820 extend from upper surface 616U of dielectric layer 616 and upper etch stop metal protected circuit pattern 414, through dielectric layer 616, and to lower patterned conductor layer 412A. Although not illustrated in FIG. 8, in one embodiment, via apertures 820 extend entirely through substrate 200. Generally, via apertures 820 are formed between upper etch stop metal protected circuit pattern 414 and lower etch stop metal protected circuit pattern 414A.

Figure 9:
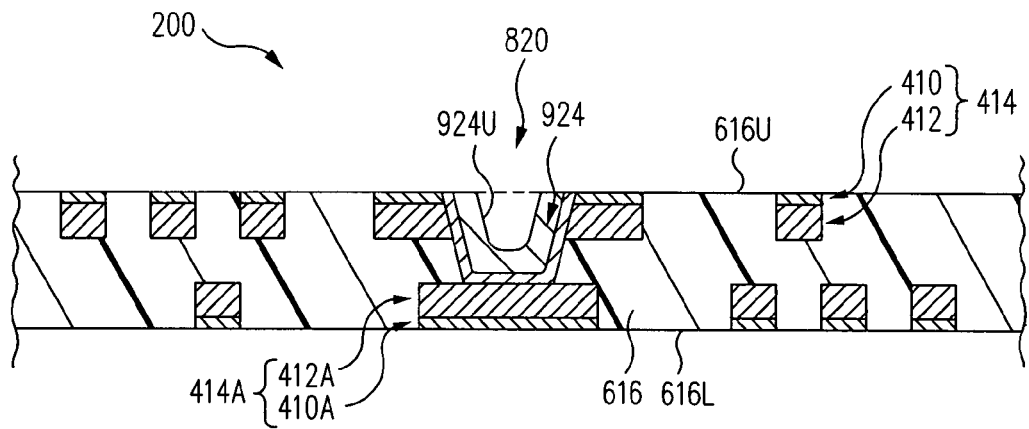

Referring now to FIGS. 1, 8 and 9 together, from LASER-ABLATE VIA APERTURES OPERATION 118, flow moves to a PLATE VIA APERTURES OPERATION 120. In PLATE VIA APERTURES OPERATION 120, via apertures 820 are plated, e.g., with copper or other conductive material.

In one embodiment, to plate via apertures 820, an electrically conductive seed layer 821 is formed within via apertures 820 and on upper surface 200U of substrate 200. In one embodiment, seed layer 821, e.g., copper, is plated using an electroless plating operation.

Seed layer 821 is then used as the electrode for electroplating an electrically conductive primary conductor layer 822, e.g., copper. Primary conductor layer 822 is formed on seed layer 821. More particularly, primary conductor layer 822 is formed within via apertures 820 and on upper surface 200U of substrate 200.

Seed layer 821 and primary conductor layer 822 collectively form a bi-layer via conductor layer 823. A lower surface 200L of substrate 200 defined by lower surface 616L of dielectric layer 616 and lower patterned etch stop layer 410A is masked or otherwise protected to prevent via conductor layer 823 from being formed thereon, e.g., by a carrier such as carrier 202A (FIG. 6).

After formation of via conductor layer 823, a via conductor layer etch process, e.g., copper etch process, is performed to remove via conductor layer 823 except within via apertures 820, i.e., via conductor layer 823 is removed from upper surface 200U of substrate 200. During this copper etch process, patterned etch stop layers 410, 410A provide an etch stop for the copper etch process thus avoiding use of a solder mask to protect conductor layers 412, 412A. Accordingly, after the copper etch process, electrically conductive vias 924 (FIG. 9) remain within via apertures 820.

Patterned etch stop layers 410, 410A provide an etch stop for the copper etch process used during REMOVE CARRIERS OPERATION 116 and during PLATE VIA APERTURES OPERATION 120. In this manner, conductor layers 412, 412A, e.g., copper, are prevented from being etched during the copper etch process. This guarantees the height and width, i.e., cross-sectional area, of conductor layers 412, 412A thus insuring that impedance is controlled to within tight tolerance.

Vias 924 electrically connect patterned conductor layers 412, 412A. In one embodiment, vias 924 are conformal to the shade of via apertures 820 and include a dimpled non-planar upper surface 924U, which is recessed below upper surface 616U of dielectric layer 616. However, in another embodiment, via apertures 820 are formed to have a planar upper surface as indicated by the dashed line substantially coplanar with upper surface 616U of dielectric layer 616.

Referring now to FIGS. 1, 9, 10, and 11 together, from PLATE VIA APERTURES OPERATION 120, flow moves, optionally, to a BLANKET OR SELECTIVELY ETCH REMOVE ETCH STOP LAYER OPERATION 122. In BLANKET OR SELECTIVELY ETCH REMOVE ETCH STOP LAYER OPERATION 122, patterned etch stop layers 410, 410A are blanket removed, i.e., entirely and non-selectively removed, or selectively removed, i.e., partially removed.

Figure 10:
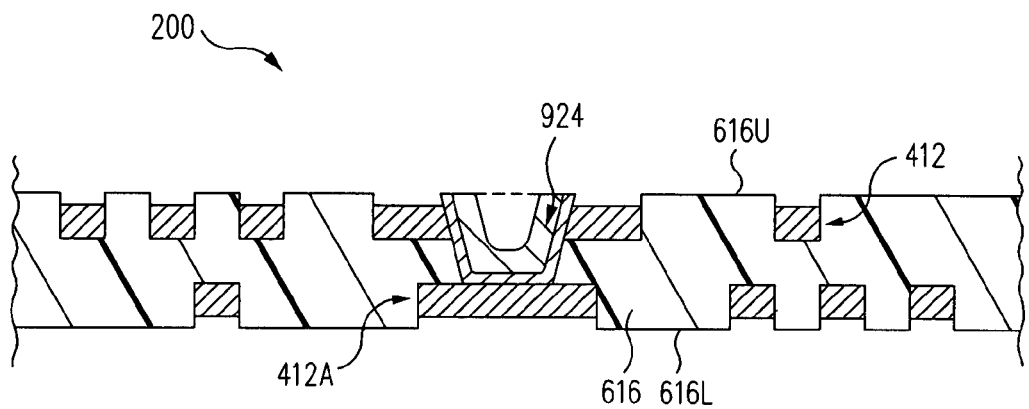

FIG. 10 illustrates an embodiment where patterned etch stop layers 410, 410A are blanket removed, i.e., entirely and non-selectively removed, e.g., using an etch stop layer etch process. An etch stop layer etch process is an etch process that etches patterned etch stop layers 410, 410A (e.g., nickel, tin, gold, or palladium) but does not etch patterned conductor layers 412, 412A (e.g., copper, silver, or solder).

Accordingly, after blanket removal of patterned etch stop layers 410, 410A, patterned conductor layers 412, 412A remain and are exposed from dielectric layer 616. Patterned conductor layers 412, 412A are recessed inward and within dielectric layer 616. More particularly, patterned conductor layer 412 is recessed inwards of upper surface 616U. Similarly, patterned conductor layer 412A is recessed inwards of lower surface 616L.

Figure 11:
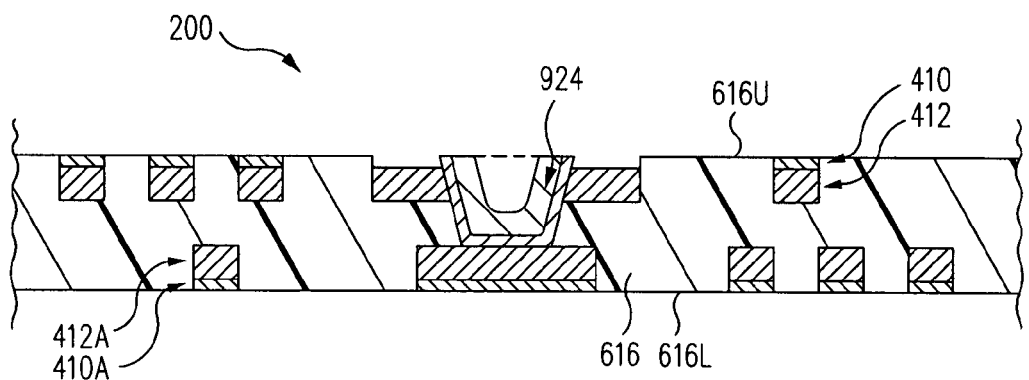

FIG. 11 illustrates an embodiment where patterned etch stop layers 410, and/or 410A are selectively removed, i.e., partially removed. Illustratively, portions of patterned etch stop layers 410, and/or 410A are masked and the unmasked exposed portions are etched using an etch stop layer etch process.

Accordingly, after selective removal of patterned etch stop layers 410, and/or 410A, first portions of patterned conductor layers 412, and/or 412A are exposed from dielectric layer 616 while second portions of patterned conductor layers 412, 412A remain covered by the remaining portions of patterned etch stop layers 410, and/or 410A.

Figure 12:
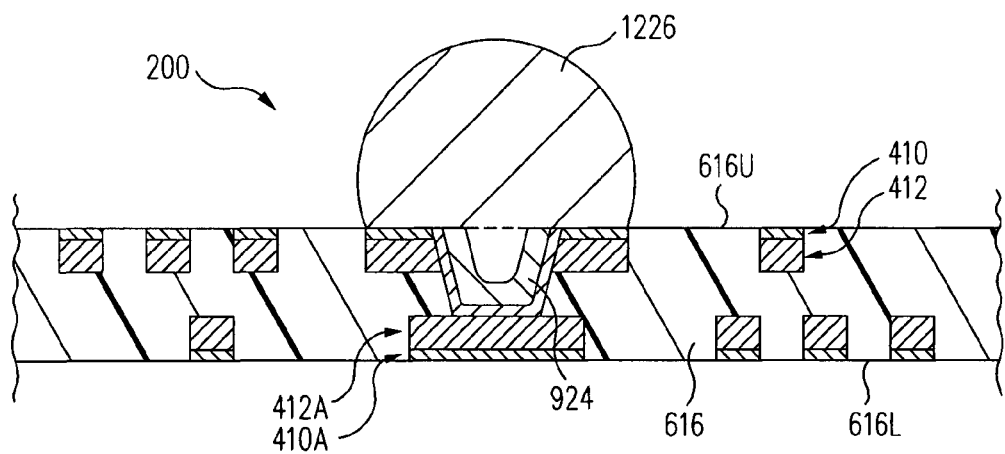

In accordance with the embodiment illustrated in FIG. 11, patterned etch stop layer 410 is removed from the portion of patterned conductor layer 412 where interconnection balls are to be formed as illustrated in FIG. 12.

Referring now to FIGS. 1 and 12 together, BLANKET OR SELECTIVELY ETCH REMOVE ETCH STOP LAYER OPERATION 122 is optional, and in one embodiment is not performed. For example, in the embodiment illustrated in FIG. 12, BLANKET OR SELECTIVELY ETCH REMOVE ETCH STOP LAYER OPERATION 122 was not performed and thus patterned etch stop layers 410, 410A remain.

From BLANKET OR SELECTIVELY ETCH REMOVE ETCH STOP LAYER OPERATION 122 (or directly from PLATE VIA APERTURES OPERATION 120 in the event that BLANKET OR SELECTIVELY ETCH REMOVE ETCH STOP LAYER OPERATION 122 is not performed), flow moves optionally to a FORM INTERCONNECTION BALLS OPERATION 124. In FORM INTERCONNECTION BALLS OPERATION 124, interconnection balls 1226 (FIG. 12), e.g., solder balls, are formed on and electrically connected to patterned conductor layers 412 and/or 412A.

Interconnection balls 1226 are formed using any one of a number of techniques well known to those skilled in the art and the particular technique used is not essential to this embodiment. Interconnection balls 1226 are used to electrically connect substrate 200 to other electrically conductive structures such as a larger substrate, e.g., a printed circuit motherboard, or other electronic components such as active and/or passive components.

FORM INTERCONNECTION BALLS OPERATION 124 is optional, and in one embodiment is not performed. From FORM INTERCONNECTION BALLS OPERATION 124 (or directly from OPERATION 122 in the event that OPERATION 124 is not performed or directly from OPERATION 120 in the event that OPERATIONS 122 and 124 are not performed), flow moves to and exits at an EXIT OPERATION 126.

Figure 13:
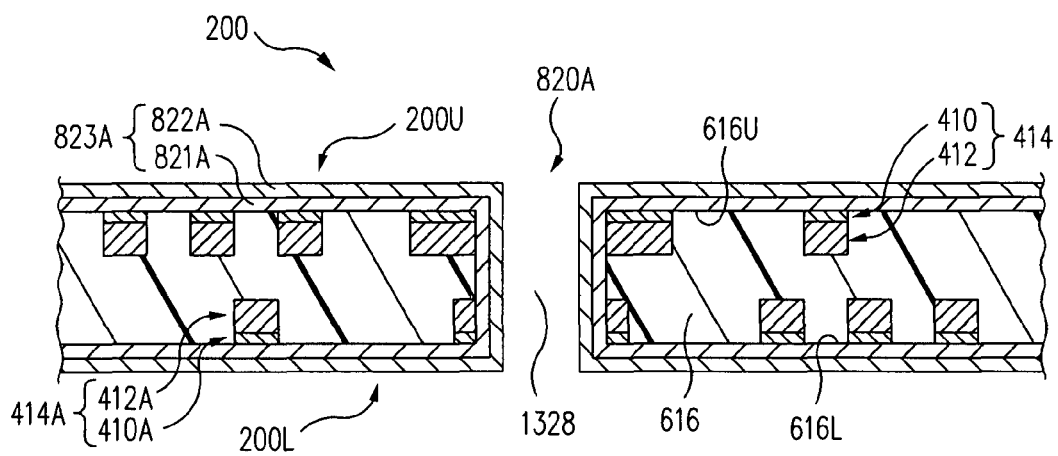
Figure 14:
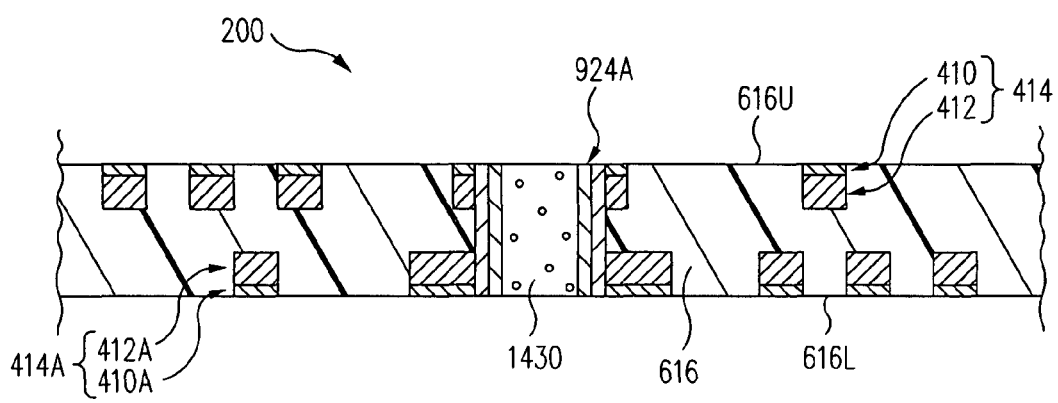

Referring now to FIGS. 1, 13 and 14 together, from REMOVE CARRIERS OPERATION 116, in another embodiment, flow moves to a DRILL VIA APERTURES OPERATION 128 instead of LASER-ABLATE VIA APERTURES OPERATION 118. In DRILL VIA APERTURES OPERATION 128, via apertures 820A are drilled, e.g., using a mechanical drill or otherwise.

Via apertures 820A are similar to via apertures 820 of FIG. 8 but may have a larger diameter and a more substantially uniform diameter cylindrical shade than via apertures 820 of FIG. 8. In one embodiment, if dielectric layer 616 is relatively thin, e.g., 0.4 mm or less, then via apertures are formed using laser-ablation. Conversely, if dielectric layer 616 is relatively thick, e.g., more than 0.4 mm, via apertures are formed by mechanical drilling.

From DRILL VIA APERTURES OPERATION 128, flow moves to a FILL VIA APERTURES OPERATION 130. In FILL VIA APERTURES OPERATION 130, via apertures 820A are filled with an electrically conductive material to form electrically conductive vias 924A (FIG. 14).

In one embodiment, to fill via apertures 820A, referring still to FIG. 13, an electrically conductive seed layer 821A is formed on all exposed surfaces of substrate 200. More particularly, seed layer 821A is formed within via apertures 820A, on upper surface 200U of substrate 200, and on lower surface 200L of substrate 200. In one embodiment, seed layer 821A is plated using an electroless plating operation.

Seed layer 821A is then used as the electrode for electroplating an electrically conductive primary conductor layer 822A, e.g., copper. Primary conductor layer 822A is formed on seed layer 821A. More particularly, primary conductor layer 822A is formed within via apertures 820A, on upper surface 200U of substrate 200, and on lower surface 200L of substrate 200.

Seed layer 821A and primary conductor layer 822A collectively form a bi-layer via conductor layer 823A. Via conductor layer 823A only partially fills via apertures 820A such that spaces 1328 exist within via conductor layer 823A within via apertures 820A.

Spaces 1328 (FIG. 13) are filled with an epoxy 1430 (FIG. 14), e.g., an electrically conductive epoxy. Via conductor layer 823A is then etched, e.g., using a copper etch process, to remove via conductor layer 823A from upper surface 200U and lower surface 200L of substrate 200. During this copper etch process, patterned etch stop layers 410, 410A provided an etch stop for the copper etch process. Further, epoxy 1430 prevents via conductor layer 823A from being removed within via apertures 820A. Accordingly, after the copper etch process, electrically conductive vias 924A remain within via apertures 820A.

From FILL VIA APERTURES OPERATION 130, flow moves to BLANKET OR SELECTIVELY ETCH REMOVE ETCH STOP LAYER OPERATION 122, which is optionally performed as discussed above.

Figure 15:
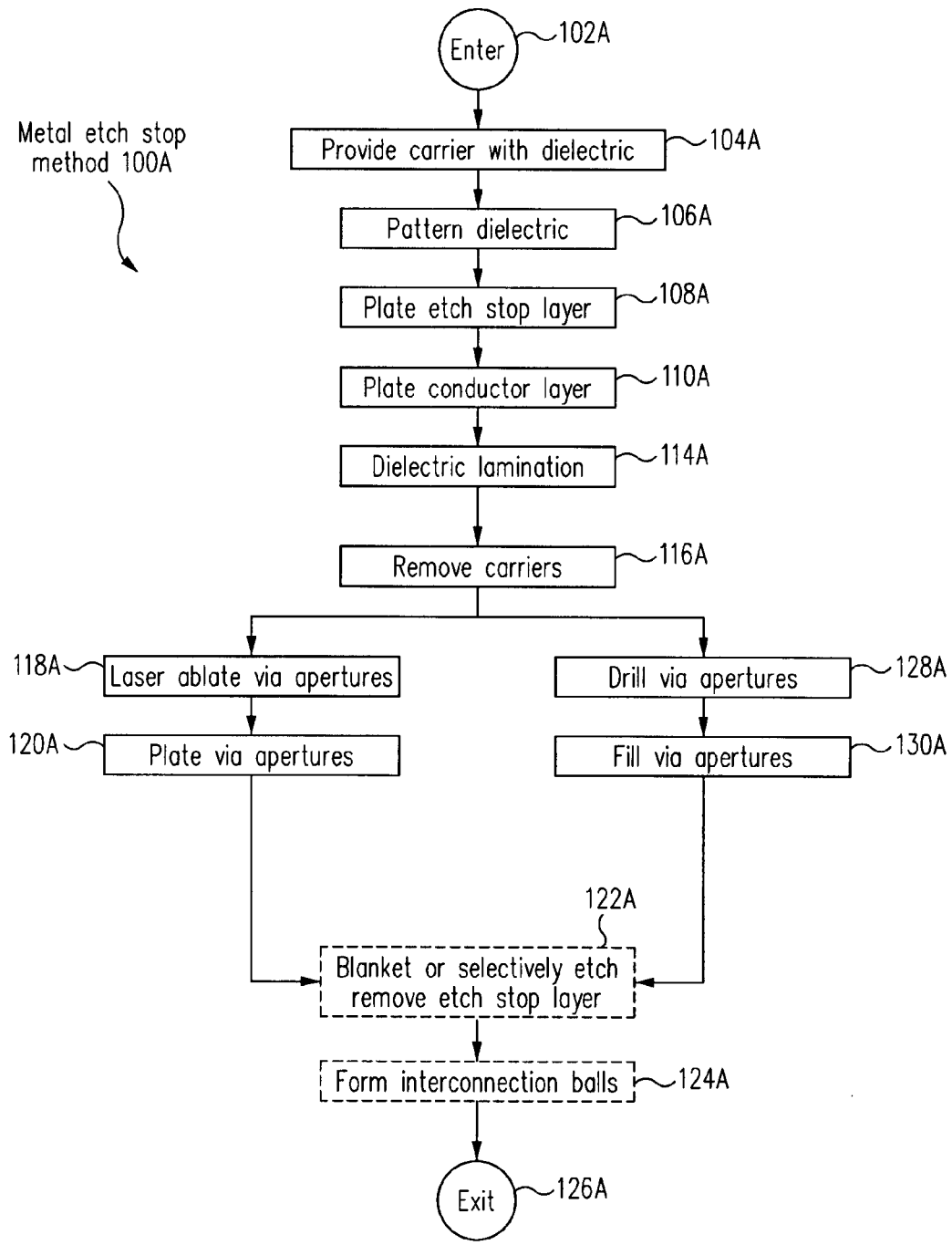
FIG. 15 is a metal etch stop method for fabricating an electronic component substrate in accordance with another embodiment of the present invention.
Figure 16:
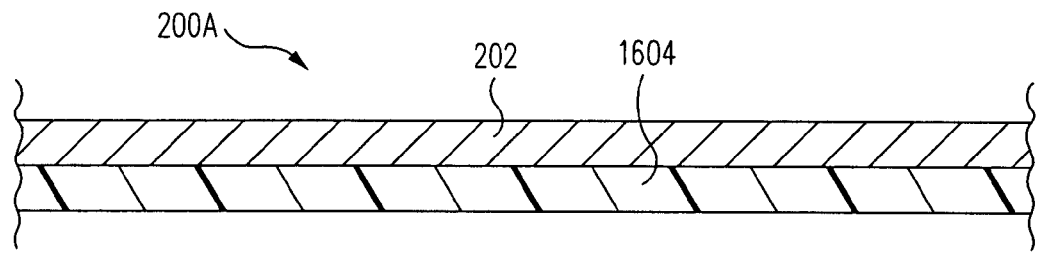
FIG. 16 is a cross-sectional view of a substrate during fabrication in accordance with one embodiment.

FIG. 15 is a metal etch stop method 100A for fabricating an electronic component substrate in accordance with another embodiment of the present invention. FIG. 16 is a cross-sectional view of a substrate 200A during fabrication in accordance with one embodiment. FIGS. 17, 18, 19, 20, 21, 22, 23, 24, 25, 26, and 27 are cross-sectional views of substrate 200A of FIG. 16 at various stages during fabrication in accordance with various embodiments of the present invention.

Metal etch stop method 100A of FIG. 15 is similar to metal etch stop method 100 of FIG. 1 and only the significant differences are discussed below. More particularly, operations 102A, 104A, 106A, 108A, 110A, 114A, 116A, 118A, 120A, 122A, 124A, 126A, 128A, 130A of FIG. 15 are similar to operations 102, 104, 106, 108, 110, 114, 116, 118, 120, 122, 124, 126, 128, 130 of FIG. 1, respectively, and only the significant differences between the operations are discussed below.

Referring now to FIGS. 15 and 16 together, from ENTER OPERATION 102A, flow moves to PROVIDE CARRIER WITH DIELECTRIC OPERATION 104A. In PROVIDE CARRIER WITH DIELECTRIC OPERATION 104A, carrier 202 is provided with a dielectric layer 1604.

Dielectric layer 1604 is a layer of dielectric, e.g., dielectric tape, dielectric film, adhesive, or other dielectric.

Figure 17:
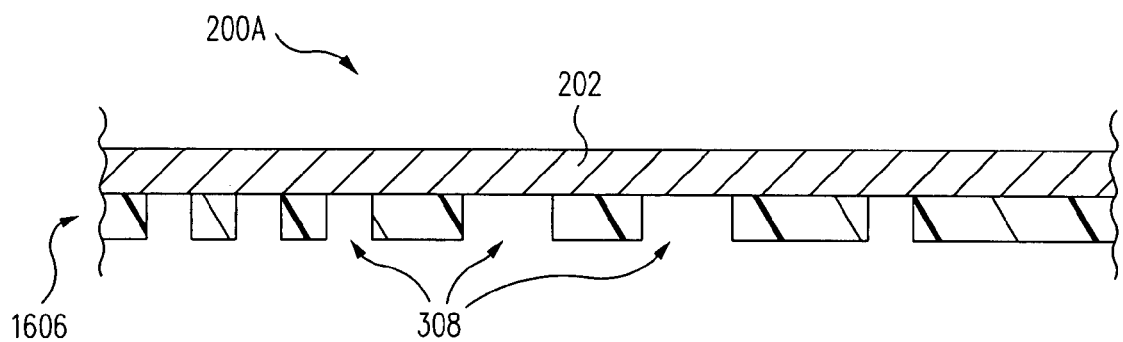
FIGS. 17, 18, 19, 20, 21, 22, 23, 24, 25, 26, and 27 are cross-sectional views of the substrate of FIG. 16 at various stages during fabrication in accordance with various embodiments of the present invention.

Referring now to FIGS. 15, 16 and 17 together, from PROVIDE CARRIER WITH DIELECTRIC OPERATION 104A, flow moves to PATTERN DIELECTRIC OPERATION 106A. In PATTERN DIELECTRIC OPERATION 106A, dielectric layer 1604 of substrate 200A of FIG. 16 is patterned to form a patterned dielectric layer 1606 as illustrated in FIG. 17. Dielectric layer 1604 is patterned using laser-ablation in one embodiment. In another embodiment, a photolithography process is used.

Dielectric layer 1604 is patterned to expose portions of carrier 202. More particularly, dielectric layer 1604 is patterned to form circuit pattern artifacts 308, i.e., openings, within dielectric layer 1604. Stated another way, patterned dielectric layer 1606 includes circuit pattern artifacts 308.

Figure 18:
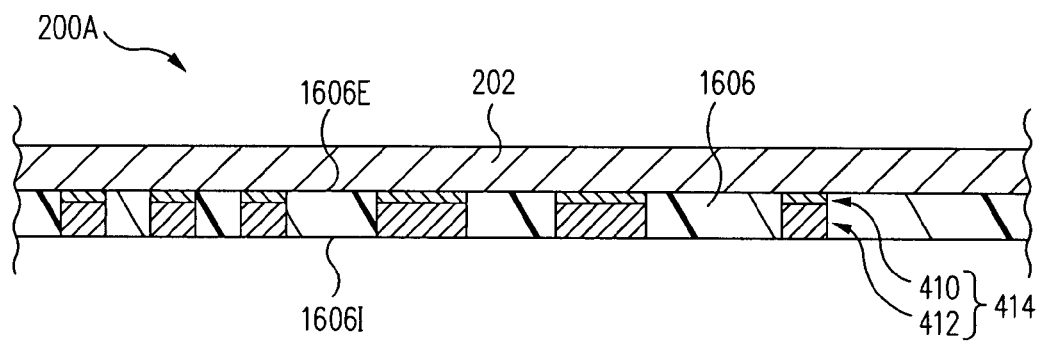

Referring now to FIGS. 15 and 18 together, from PATTERN DIELECTRIC OPERATION 106A, flow moves to PLATE ETCH STOP LAYER OPERATION 108A. In PLATE ETCH STOP LAYER OPERATION 108A, a patterned etch stop layer 410 of an etch stop metal is plated within circuit pattern artifacts 308 of patterned dielectric layer 1606.

From PLATE ETCH STOP LAYER OPERATION 108A, flow moves to PLATE CONDUCTOR LAYER OPERATION 110A. In PLATE CONDUCTOR LAYER OPERATION 110A, a patterned conductor layer 412 of a conductor metal is plated on patterned etch stop layer 410 within circuit pattern artifacts 308 of patterned dielectric layer 1606. Patterned etch stop layer 410 and patterned conductor layer 412 thus form an etch stop metal protected circuit pattern 414 on carrier 202 and within circuit pattern artifacts 308 of patterned dielectric layer 1606.

Patterned conductor layer 412, i.e., the interior surface (lower in the view of FIG. 18), is substantially coplanar with an interior surface 1606I of patterned dielectric layer 1606. Patterned etch stop layer 410, i.e., the exterior surface (upper in the view of FIG. 18), is substantially coplanar with an exterior surface 1606E of patterned dielectric layer 1606.

Figure 19:
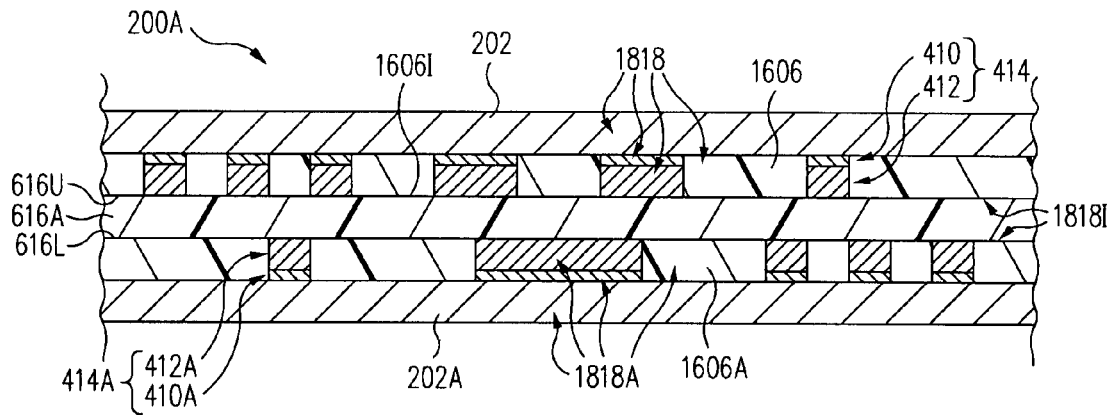

Referring now to FIGS. 15 and 19 together, from PLATE CONDUCTOR LAYER OPERATION 110A, flow moves to DIELECTRIC LAMINATION OPERATION 114A. In DIELECTRIC LAMINATION OPERATION 114A, etch stop metal protected circuit patterns 414, 414A are laminated to a dielectric material 616A.

More particularly, as shown in FIG. 19, etch stop metal protected circuit pattern 414 of FIG. 18 is laminated into an upper, e.g., first, surface 616U of dielectric material 616A. A lower etch stop metal protected circuit pattern 414A is laminated into a lower, e.g., second, surface 616L of dielectric material 616A.

Second etch stop metal protected circuit pattern 414A is on a carrier 202A and within a patterned dielectric layer 1606A. Second etch stop metal protected circuit pattern 414A includes a patterned etch stop layer 410A and a patterned conductor layer 412A. Second etch stop metal protected circuit pattern 414A is formed on carrier 202A and within patterned dielectric layer 1606A in a manner similar or identical to the formation of etch stop metal protected circuit pattern 414 on carrier 202, and so is not repeated again. In the view of FIG. 19, patterned conductor layer 412A is above patterned etch stop layer 410A whereas patterned conductor layer 412 is below patterned etch stop layer 410 facilitating lamination of patterned conductor layers 412, 412A into dielectric layer 616A.

Etch stop metal protected circuit pattern 414, carrier 202, and patterned dielectric layer 1606 form an etch stop metal protected circuit pattern carrier structure 1818. Generally, the interior surface of patterned conductor layer 412 and interior surface 1606I of patterned dielectric layer 1606 collectively form an interior planar surface 1818I of etch stop metal protected circuit pattern carrier structure 1818.

Etch stop metal protected circuit pattern 414, carrier 202, and patterned dielectric layer 1606 are sometimes referred to upper, e.g., first, etch stop metal protected circuit pattern 414, carrier 202, and patterned dielectric layer 1606, respectively.

Similarly, etch stop metal protected circuit pattern 414A, carrier 202A, and patterned dielectric layer 1606A are sometimes referred to lower, e.g., second, etch stop metal protected circuit pattern 414A, carrier 202A, and patterned dielectric layer 1606A, respectively. Etch stop metal protected circuit pattern 414A, carrier 202A, and patterned dielectric layer 1606A form a lower, e.g., second, etch stop metal protected circuit pattern carrier structure 1818A having an interior surface 1818I.

Dielectric layer 616A is glass impregnated resin, e.g., printed circuit board material, dielectric film, epoxy, or other dielectric material.

Generally, during DIELECTRIC LAMINATION OPERATION 114A, upper etch stop metal protected circuit pattern carrier structure 1818 is united with lower etch stop metal protected circuit pattern carrier structure 1818A by dielectric layer 616A.

In accordance with one embodiment, upper etch stop metal protected circuit pattern carrier structure 1818, i.e., interior surface 1818I, is placed on upper surface 616U of dielectric layer 616A and lower etch stop metal protected circuit pattern 1818A, i.e., interior surface 1818I, is placed on lower surface 616L of dielectric layer 616A. The assembly is heated while etch stop metal protected circuit patterns 1818, 1818A are pressed into dielectric layer 616A.

Due to the heat and pressure, dielectric layer 616 is caused to bond to etch stop metal protected circuit pattern carrier structures 1818, 1818A, i.e., to interior surfaces 1818I thereof.

Figure 20:
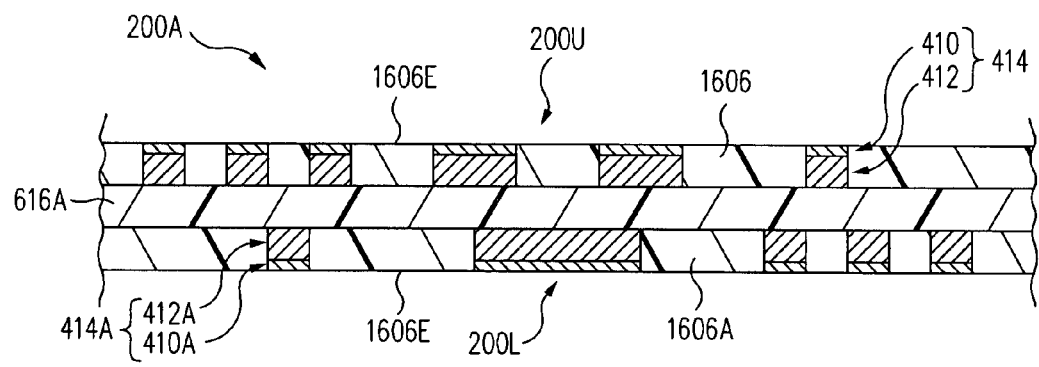

Referring now to FIGS. 15, 19 and 20 together, from DIELECTRIC LAMINATION OPERATION 114A, flow moves to REMOVE CARRIERS OPERATION 116A. In REMOVE CARRIERS OPERATION 116A, carriers 202, 202A are removed.

As illustrated in FIG. 20, patterned etch stop layers 410, 410A, i.e., the exterior surfaces thereof, are substantially coplanar with exterior surfaces 1606E of patterned dielectric layers 1606, 1606A and define upper and lower surface 200U, 200L of substrate 200A, respectively.

Figure 21:
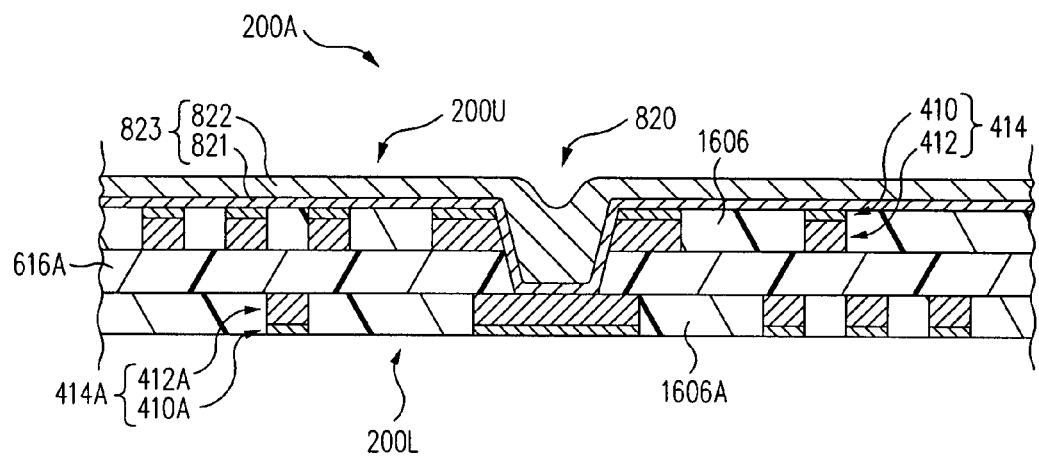

Referring now to FIGS. 15 and 21 together, from REMOVE CARRIERS OPERATION 116A, flow moves to LASER-ABLATE VIA APERTURES OPERATION 118A. In LASER-ABLATE VIA APERTURES OPERATION 118A, via apertures 820 are formed in substrate 200A using laser-ablation.

Figure 22:
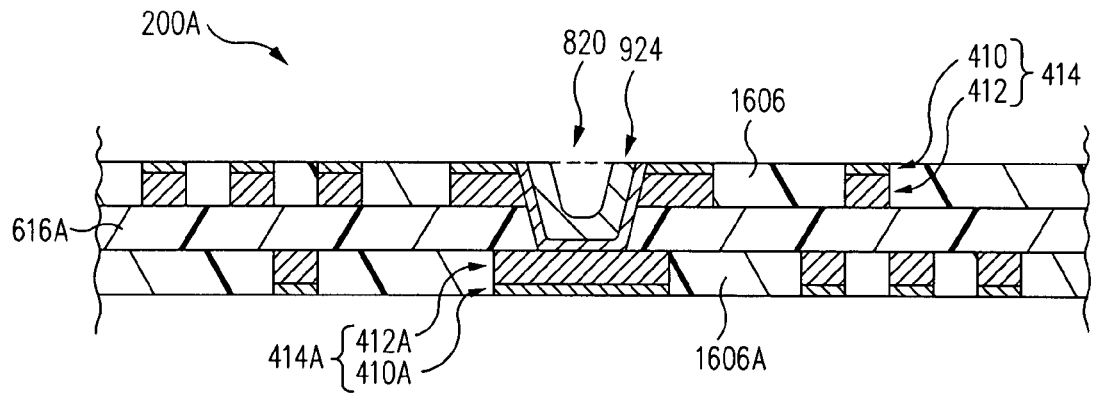

Referring now to FIGS. 15, 21 and 22 together, from LASER-ABLATE VIA APERTURES OPERATION 118A, flow moves to PLATE VIA APERTURES OPERATION 120A. In PLATE VIA APERTURES OPERATION 120A, via apertures 820 are plated, e.g., with copper or other conductive material.

In one embodiment, to plate via apertures 820, an electrically conductive seed layer 821 is formed within via apertures 820 and on upper surface 200U of substrate 200A. In one embodiment, seed layer 821, e.g., copper, is plated using an electroless plating operation. Primary conductor layer 822 is formed on seed layer 821. Seed layer 821 and primary conductor layer 822 collectively form a bi-layer via conductor layer 823.

After formation of via conductor layer 823, a copper etch process is performed to remove via conductor layer 823 except within via apertures 820, i.e., via conductor layer 823 is removed from upper surfaces 200U of substrate 200A. During this copper etch process, patterned etch stop layers 410, 410A provide an etch stop for the copper etch process. Accordingly, after the copper etch process, electrically conductive vias 924 remain within via apertures 820. Vias 924 electrically connect patterned conductor layers 412, 412A.

Referring now to FIGS. 15, 22, 23, and 24 together, from PLATE VIA APERTURES OPERATION 120A, flow moves, optionally, to BLANKET OR SELECTIVELY ETCH REMOVE ETCH STOP LAYER OPERATION 122A. In BLANKET OR SELECTIVELY ETCH REMOVE ETCH STOP LAYER OPERATION 122A, patterned etch stop layers 410, 410A are blanket removed, i.e., entirely and non-selectively removed, or selectively removed, i.e., partially removed.

Figure 23:
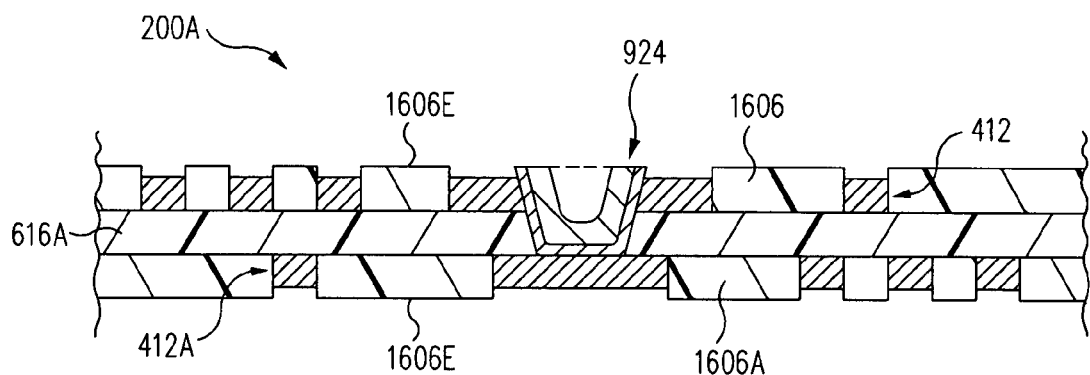

FIG. 23 illustrates an embodiment where patterned etch stop layers 410, 410A are blanket removed, i.e., entirely and non-selectively removed. Accordingly, after blanket removal of patterned etch stop layers 410, 410A, patterned conductor layers 412, 412A remain within and are exposed from patterned dielectric layers 1606, 1606A, respectively. Patterned conductor layers 412, 412A are recessed within patterned dielectric layers 1606, 1606A, respectively. More particularly, patterned conductor layer 412 is recessed inwards of exterior surface 1606E of patterned dielectric layer 1606. Similarly, patterned conductor layer 412A is recessed inwards of exterior surface 1606E of patterned dielectric layer 1606A.

Figure 24:
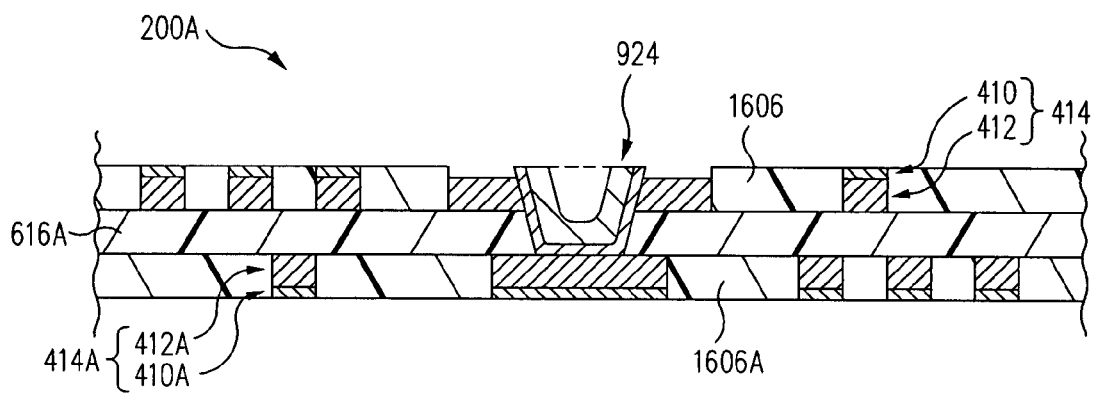

FIG. 24 illustrates an embodiment where patterned etch stop layers 410, and/or 410A are selectively removed, i.e., partially removed. Accordingly, after selective removal of patterned etch stop layers 410, and/or 410A, first portions of patterned conductor layers 412, and/or 412A are exposed from patterned dielectric layers 1606, 1606A while second portions of patterned conductor layers 412, and/or 412A remain covered within the remaining portions of etch stop layers 410, and/or 410A.

Figure 25:
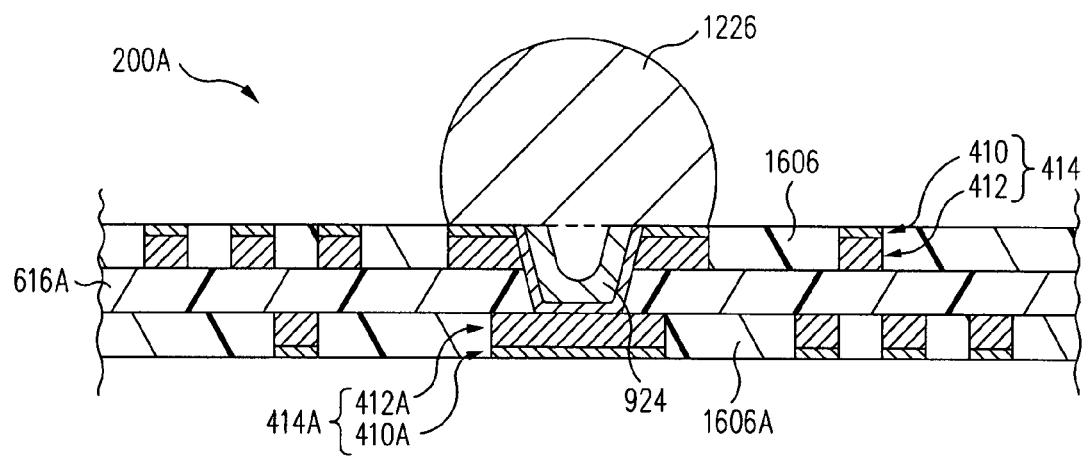

In accordance with the embodiment illustrated in FIG. 24, patterned etch stop layer 410 is removed from the portions of patterned conductor layer 412 where interconnection balls are to be formed as illustrated in FIG. 25.

From BLANKET OR SELECTIVELY ETCH REMOVE ETCH STOP LAYER OPERATION 122A (or directly from PLATE VIA APERTURES OPERATION 120A in the event that BLANKET OR SELECTIVELY ETCH REMOVE ETCH STOP LAYER OPERATION 122A is not performed), flow moves optionally to FORM INTERCONNECTION BALLS OPERATION 124A. In FORM INTERCONNECTION BALLS OPERATION 124A, interconnection balls 1226 (FIG. 25), e.g., solder balls, are formed.

Interconnection balls 1226 are formed using any one of a number of techniques well known to those skilled in the art and the particular technique used is not essential to this embodiment. Interconnection balls 1226 are used to electrically connect substrate 200A to other electrically conductive structures such as a larger substrate, e.g., a printed circuit motherboard, or other electronic components such as active and/or passive components.

From FORM INTERCONNECTION BALLS OPERATION 124A (or directly from OPERATION 122A in the event that OPERATION 124A is not performed or directly from Operation 120A in the event that OPERATIONS 122A and 124A are not performed), flow moves to and exits at EXIT OPERATION 126A.

Figure 26:
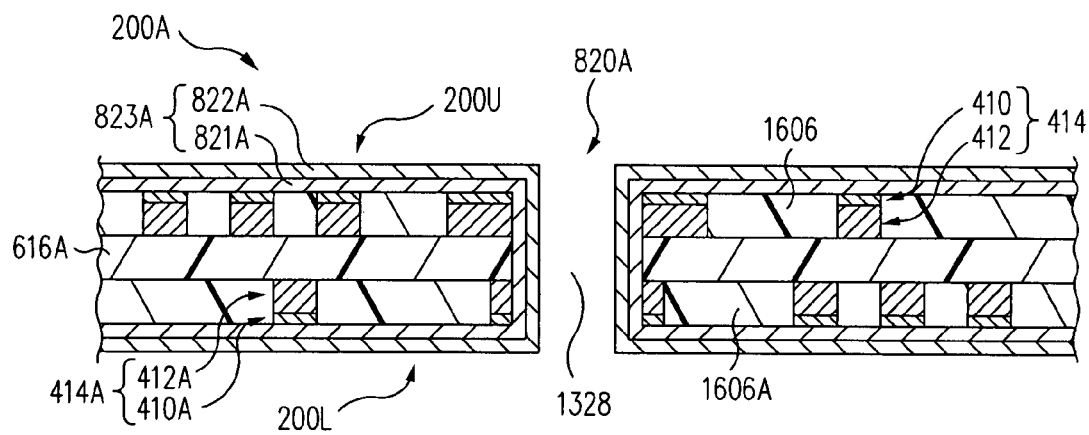
Figure 27:
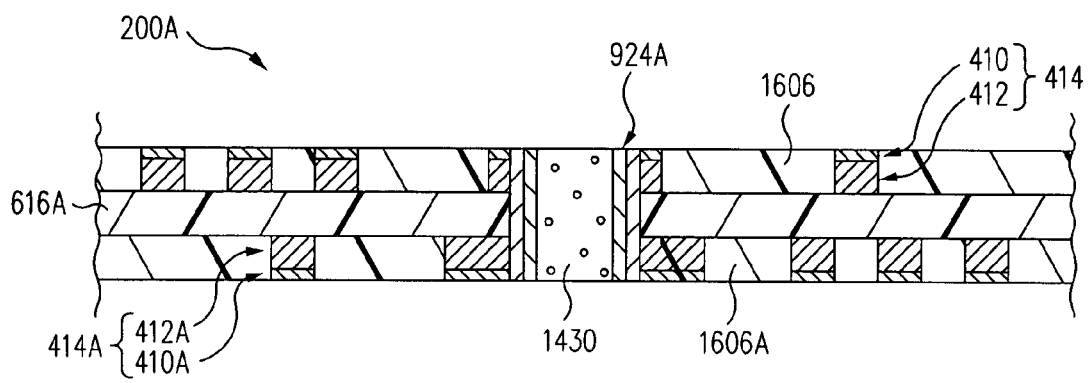

Referring now to FIGS. 15, 26 and 27 together, from REMOVE CARRIERS OPERATION 116, in another embodiment, flow moves to DRILL VIA APERTURES OPERATION 128A instead of LASER-ABLATE VIA APERTURES OPERATION 118A. In DRILL VIA APERTURES OPERATION 128A, via apertures 820A are drilled, e.g., using a mechanical drill or otherwise.

From DRILL VIA APERTURES OPERATION 128A, flow moves to FILL VIA APERTURES OPERATION 130A. In FILL VIA APERTURES OPERATION 130A, via apertures 820A are filled with an electrically conductive material to form electrically conductive vias 924A.

In one embodiment, to fill via apertures 820A, an electrically conductive seed layer 821A is formed. Primary conductor layer 822A is formed on seed layer 821A. Seed layer 821A and primary conductor layer 822A collectively form a bi-layer via conductor layer 823A. Via conductor layer 823A only partially fills via apertures 820A such that spaces 1328 exist within via conductor layer 823A within via apertures 820A.

Spaces 1328 are filled with an epoxy 1430, e.g., an electrically conductive epoxy. Via conductor layer 823A is then etched, e.g., using a copper etch process. Accordingly, after the copper etch process, electrically conductive vias 924A remain within via apertures 820A.

From FILL VIA APERTURES OPERATION 130A, flow moves to BLANKET OR SELECTIVELY ETCH REMOVE ETCH STOP LAYER OPERATION 122A, which is optionally performed as discussed above.

Although methods 100, 100A, 2900 (FIGS. 1, 15, 29) are described herein as forming structures having two patterned conductor layers, operations of methods 100, 100A, 2900 can be repeated to form structures having more than two patterned conductor layers.

Figure 28:
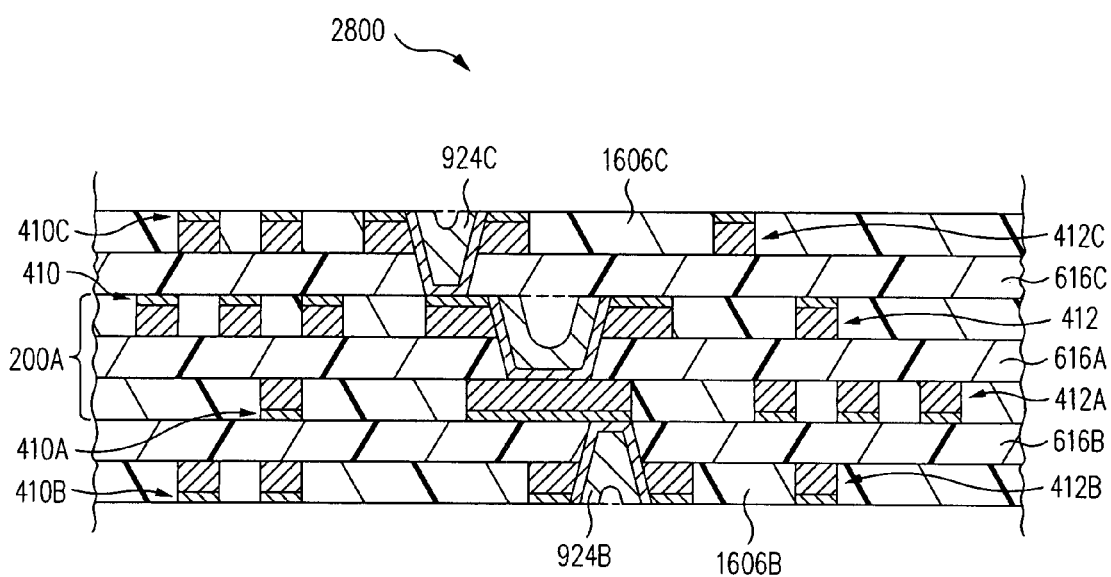
FIG. 28 is a cross-sectional view of a substrate having four conductor layers in accordance with one embodiment of the present invention.

FIG. 28 is a cross-sectional view of a substrate 2800 having four conductor layers 412, 412A, 412B, 412C in accordance with one embodiment of the present invention. More particularly, substrate 2800 of FIG. 28 includes substrate 200A of FIG. 22, with two additional patterned conductor layers 412B, 412C laminated by dielectric material 616B, 616C, respectively.

Patterned conductor layers 412B, 412C are electrically connected to patterned conductor layers 412A, 412 by electrically conductive vias 924B, 924C, respectively. Patterned conductor layers 412B, 412C are formed within patterned dielectric layers 1606B, 1606C. Further, patterned conductor layers 412B, 412C are protected by patterned etch stop layers 410B, 410C however, patterned etch stop layers 410, 410A, 410B and/or 410C are blanket or selectively etch removed in other embodiments.

Further, structures of metal etch stop method 100A (FIG. 15) can be combined with structures of metal etch stop method 100 (FIG. 1) to form a multilayer substrate in accordance with other embodiments of the present invention.

Figure 29:
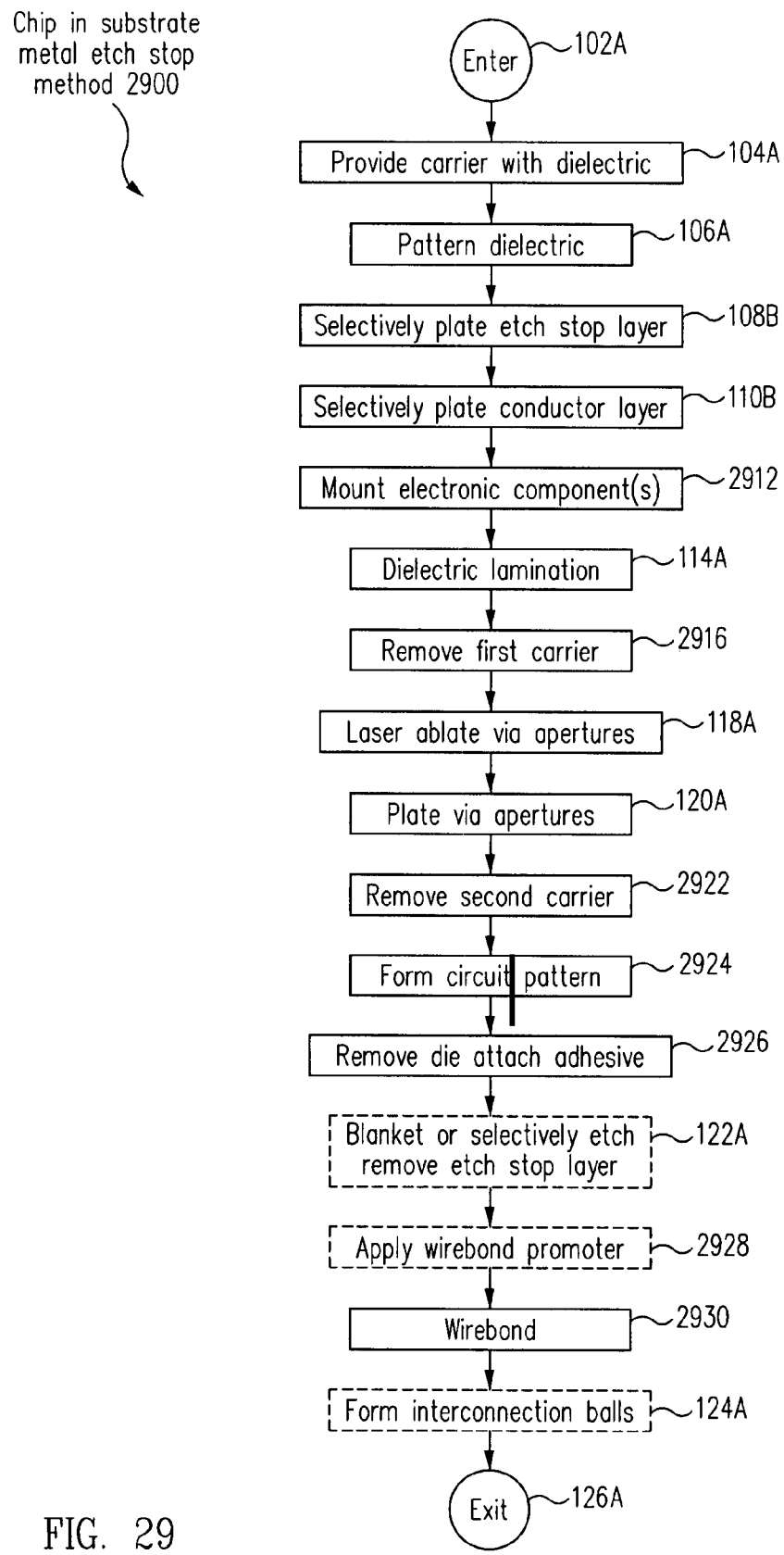
FIG. 29 is a chip in substrate metal etch stop method for fabricating an electronic component package in accordance with one embodiment of the present invention.
Figure 30:
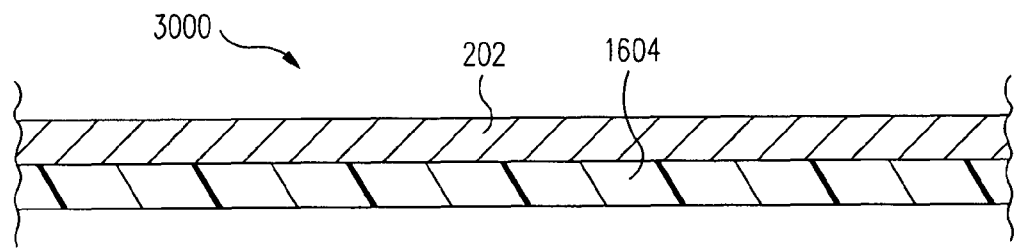
FIG. 30 is a cross-sectional view of a package during fabrication in accordance with one embodiment.

FIG. 29 is a chip in substrate metal etch stop method 2900 for fabricating an electronic component package in accordance with one embodiment of the present invention. FIG. 30 is a cross-sectional view of an electronic component package 3000 during fabrication in accordance with one embodiment. FIGS. 31, 32, 33, 34, 35, 36, 37, 38 and 39 are cross-sectional views of package 3000 of FIG. 30 at various stages during fabrication in accordance with various embodiments of the present invention.

Chip in substrate metal etch stop method 2900 of FIG. 29 is similar to metal etch stop method 100A of FIG. 15 and only the significant differences are discussed below. More particularly, OPERATIONS 102A, 104A, 106A, 108B, 110B, 114A, 118A, 120A, 122A, 124A, and 126A of FIG. 29 are similar or identical to OPERATIONS 102A, 104A, 106A, 108A, 110A, 114A, 118A, 120A, 122A, 124A, and 126A of FIG. 15, respectively, and only the significant differences between the operations are discussed below.

Referring now to FIGS. 29 and 30 together, from ENTER OPERATION 102A, flow moves to PROVIDE CARRIER WITH DIELECTRIC OPERATION 104A. In PROVIDE CARRIER WITH DIELECTRIC OPERATION 104A, carrier 202 is provided with dielectric layer 1604.

Figure 31:
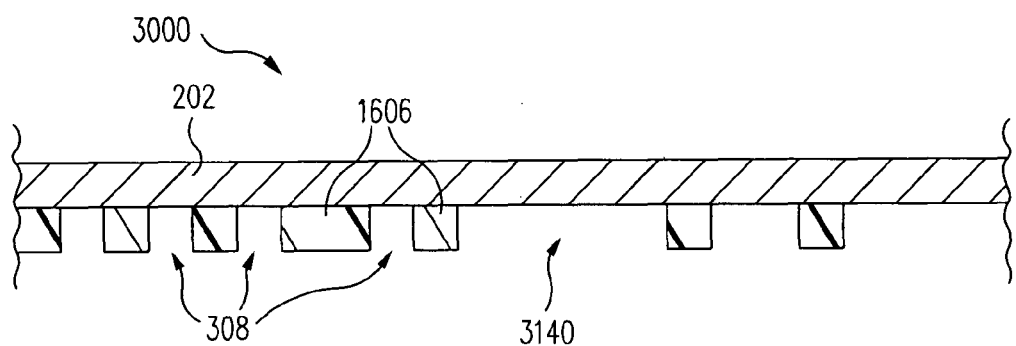
FIGS. 31, 32, 33, 34, 35, 36, 37, 38 and 39 are cross-sectional views of the package of FIG. 30 at various stages during fabrication in accordance with various embodiments of the present invention.

Referring now to FIGS. 29, 30 and 31 together, from PROVIDE CARRIER WITH DIELECTRIC OPERATION 104A, flow moves to PATTERN DIELECTRIC OPERATION 106A. In PATTERN DIELECTRIC OPERATION 106A, dielectric layer 1604 of package 3000 of FIG. 30 is patterned to form a patterned dielectric layer 1606 as illustrated in FIG. 31.

More particularly, referring to FIG. 31, dielectric layer 1604 is patterned to expose portions of carrier 202. More particularly, dielectric layer 1604 is patterned to form circuit pattern artifacts 308, i.e., openings, within dielectric layer 1604.

Dielectric layer 1604 is also patterned to form one or more electronic component openings 3140 within dielectric layer 1604, in which electronic components are mounted as discussed below. Stated another way, patterned dielectric layer 1606 includes circuit pattern artifacts 308 and electronic component openings 3140. For simplicity of discussion, a single electronic component openings 3140 is illustrated and discussed below, however, it is to be understood that a plurality of electronic component openings 3140 are formed in one embodiment.

Figure 32:
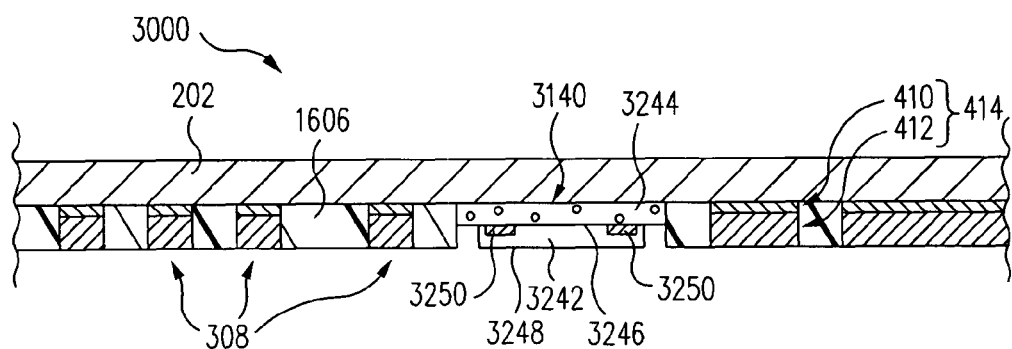

Referring now to FIGS. 29 and 32 together, from PATTERN DIELECTRIC OPERATION 106A, flow moves to SELECTIVELY PLATE ETCH STOP LAYER OPERATION 108B. In SELECTIVELY PLATE ETCH STOP LAYER OPERATION 108B, a patterned etch stop layer 410 of an etch stop metal is selectively plated within circuit pattern artifacts 308 of patterned dielectric layer 1606. Illustratively, electronic component opening 3140 is masked or otherwise protected to prevent plating of the etch stop metal in electronic component opening 3140.

More particularly, patterned etch stop layer 410 is plated in circuit pattern artifacts 308 but not in electronic component opening 3140. Accordingly, carrier 202 remains exposed through electronic component opening 3140.

From selectively PLATE ETCH STOP LAYER OPERATION 108A, flow moves to SELECTIVELY PLATE CONDUCTOR LAYER OPERATION 110B. In SELECTIVELY PLATE CONDUCTOR LAYER OPERATION 110B, a patterned conductor layer 412 of a conductor metal is selectively plated on patterned etch stop layer 410 within circuit pattern artifacts 308 of patterned dielectric layer 1606. Illustratively, electronic component opening 3140 is masked or otherwise protected to prevent plating of the conductor metal in electronic component opening 3140.

More particularly, patterned conductor layer 412 is plated in circuit pattern artifacts 308 but not in electronic component opening 3140. Accordingly, carrier 202 remains exposed through electronic component opening 3140.

Patterned etch stop layer 410 and patterned conductor layer 412 thus form an etch stop metal protected circuit pattern 414 on carrier 202 and within circuit pattern artifacts 308 of patterned dielectric layer 1606.

In an alternative embodiment, circuit pattern artifacts 308 of patterned dielectric layer 1606 are formed. Etch stop metal protected circuit pattern 414 is formed on carrier 202 and within circuit pattern artifacts 308 of patterned dielectric layer 1606. After formation of etch stop metal protected circuit pattern 414, electronic component opening 3140 is formed.

From SELECTIVELY PLATE CONDUCTOR LAYER OPERATION 110B, flow moves to a MOUNT ELECTRONIC COMPONENT(S) OPERATION 2912. In MOUNT ELECTRONIC COMPONENT(S) OPERATION 2912, an electronic component(s) 3242, e.g., an integrated circuit die, is mounted within electronic component opening 3140 with a die attach adhesive 3244.

In accordance with this embodiment, electronic component 3242, hereinafter referred to as integrated circuit die 3242, includes an active surface 3246, and an inactive surface 3248 opposite active surface 3246. Integrated circuit die 3242 further includes bond pads 3250 formed on active surface 3246.

As illustrated in FIG. 32, active surface 3246 of integrated circuit die 3242 is mounted to carrier 202 by die attach adhesive 3244.

Figure 33:
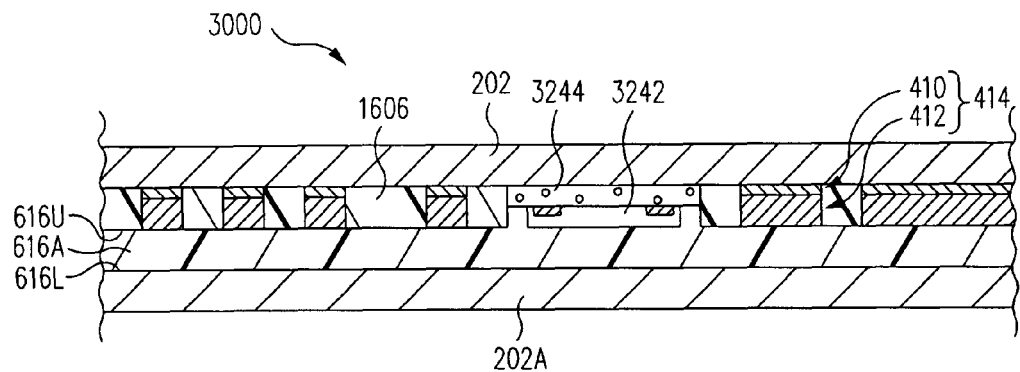

Referring now to FIGS. 29 and 33 together, from MOUNT ELECTRONIC COMPONENT(S) OPERATION 2912, flow moves to DIELECTRIC LAMINATION OPERATION 114A. In DIELECTRIC LAMINATION OPERATION 114A, etch stop metal protected circuit pattern 414 is laminated to a dielectric material 616A.

More particularly, as shown in FIG. 33, etch stop metal protected circuit pattern 414 of FIG. 32 is laminated to upper surface 616U of dielectric material 616A. Dielectric material 616A flows around integrated circuit die 3242 during the lamination. A lower carrier 202A is laminated into lower surface 616L of dielectric material 616A.

Figure 34:
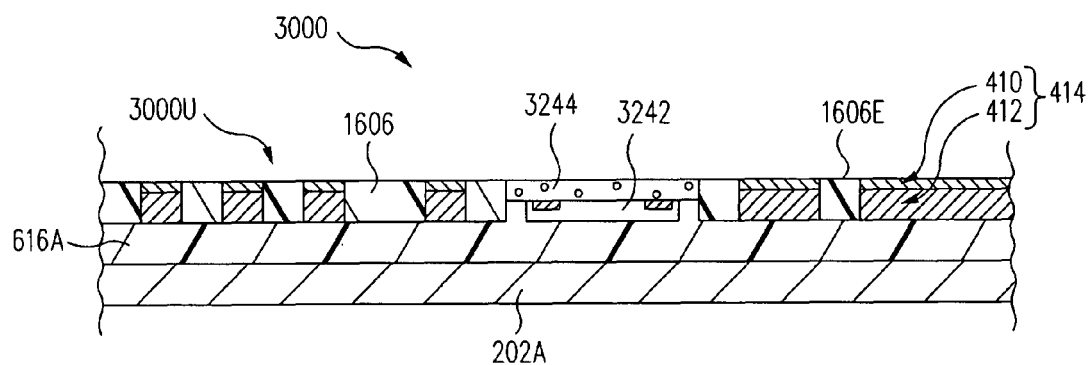

Referring now to FIGS. 29, 33 and 34 together, from DIELECTRIC LAMINATION OPERATION 114A, flow moves to a REMOVE FIRST CARRIER OPERATION 2916. In REMOVE FIRST CARRIER OPERATION 2916, carrier 202 is removed, e.g., carrier 202 is removed by etching or peeling.

As illustrated in FIG. 34, patterned etch stop layer 410 and die attach adhesive 3244, i.e., the exterior surfaces thereof, are substantially coplanar with exterior surface 1606E of patterned dielectric layer 1606 and define an upper surface 3000U of package 3000.

Figure 35:
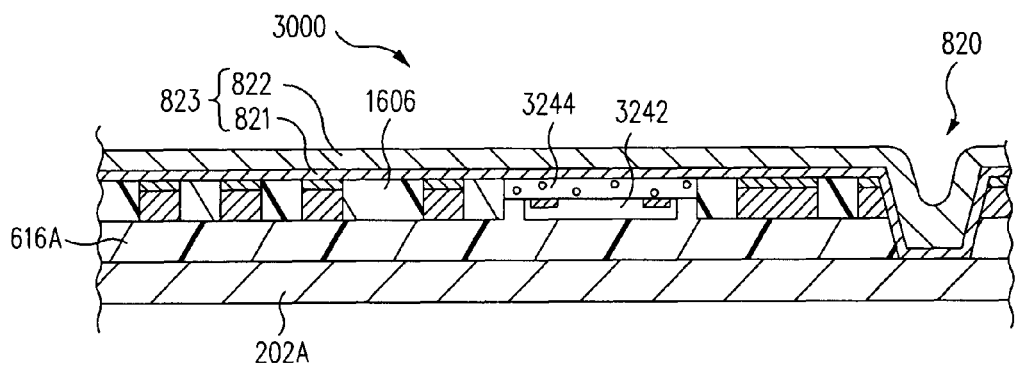
Figure 36:
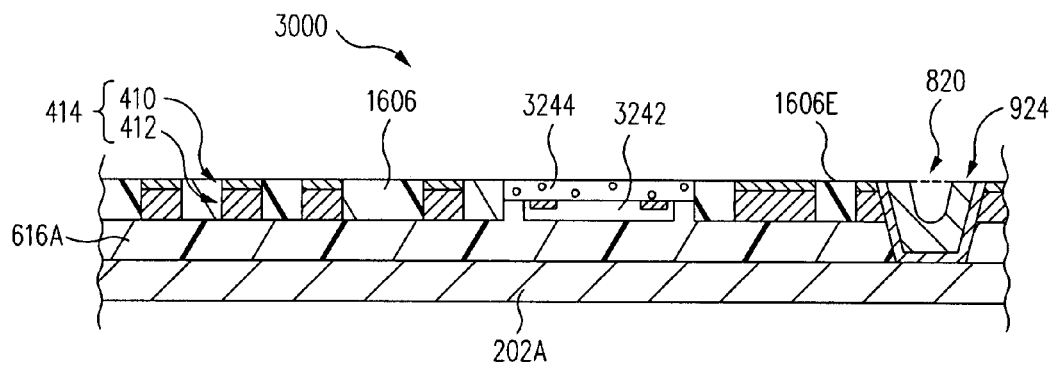

Referring now to FIGS. 29, 35 and 36 together, from REMOVE FIRST CARRIER OPERATION 2916, flow moves to LASER-ABLATE VIA APERTURES OPERATION 118A. In LASER-ABLATE VIA APERTURES OPERATION 118A, via apertures 820 are formed in package 3000 using laser-ablation.

From LASER-ABLATE VIA APERTURES OPERATION 118A, flow moves to PLATE VIA APERTURES OPERATION 120A. In PLATE VIA APERTURES OPERATION 120A, via apertures 820 are plated with via conductor layer 823 in a manner similar to that discussed above to form vias 924 within via apertures 820. Vias 924 are electrically connected to patterned conductor layer 412 and extend through dielectric material 616A to carrier 202A.

In one embodiment, vias are formed using carrier 202A as the electroplating electrode. Although a seed layer is set forth above in various embodiments, in other embodiments, a via conductor layer is formed without a seed layer.

However, in another embodiment, instead of forming via apertures 820 and vias 924, via apertures and vias (FIGS. 26, 27) similar to via apertures 820A and vias 924A are formed using operations similar to DRILL VIA APERTURES OPERATION 128A and FILL VIA APERTURES OPERATION 130A of FIG. 15.

Figure 37:
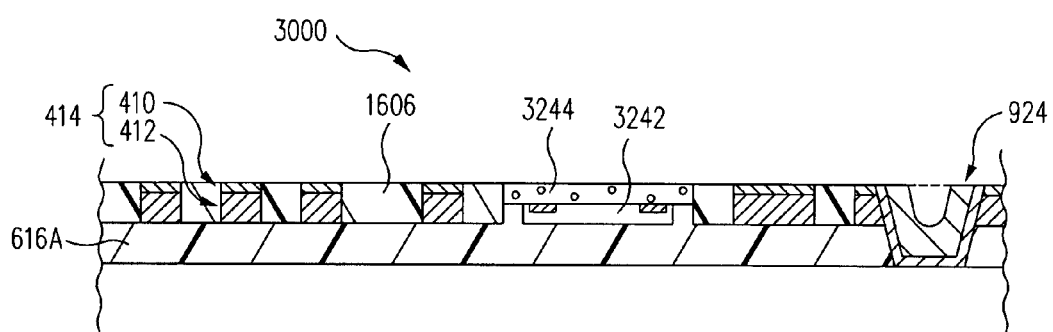

Referring now to FIGS. 29, 36 and 37 together, from PLATE VIA APERTURES OPERATION 120A, flow moves to a REMOVE SECOND CARRIER OPERATION 2922. In REMOVE SECOND CARRIER OPERATION 2922, carrier 202A is removed.

Figure 38:
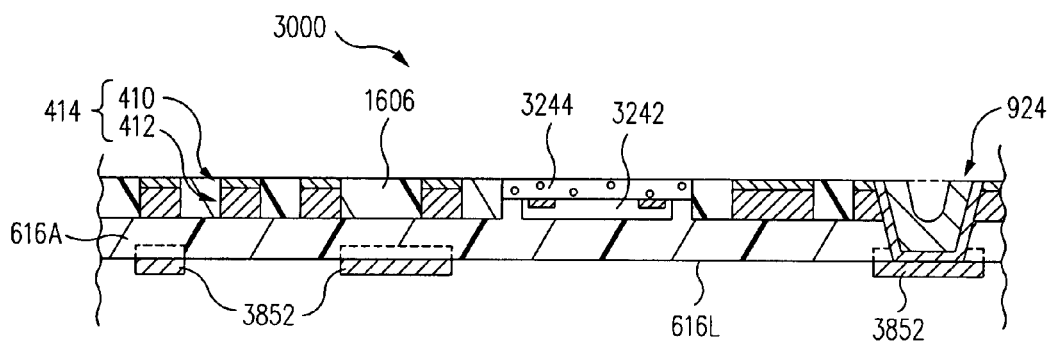

Referring now to FIGS. 29 and 38 together, from REMOVE SECOND CARRIER OPERATION 2922, flow moves to a FORM CIRCUIT PATTERN OPERATION 2924. In FORM CIRCUIT PATTERN OPERATION 2924, an electrically conductive circuit pattern 3852 is formed on lower surface 616L of dielectric material 616A. Circuit pattern 3852 is formed using any one of a number of techniques and the particular technique used is not essential to this embodiment.

In accordance with another embodiment illustrated by the dashed lines, circuit pattern 3852 is formed embedded within lower surface 616L of dielectric material 616A. Illustratively, laser-ablated artifacts are formed in lower surface 616L using laser ablation. These laser-ablated artifacts are filled with an electrically conductive material to form circuit pattern 3852.

Circuit pattern 3852 is electrically connected to patterned conductor layer 412 by vias 924.

Figure 39:
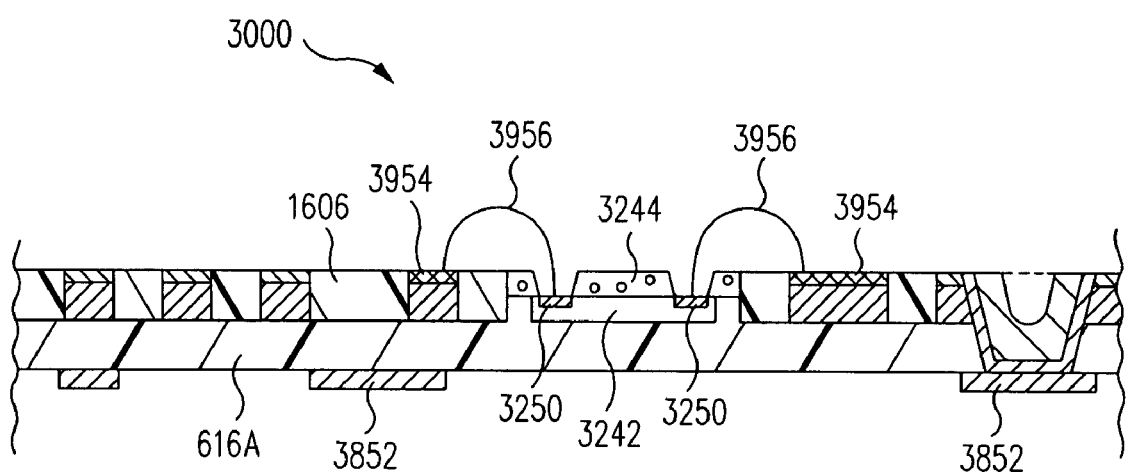

Referring now to FIGS. 29 and 39 together, from FORM CIRCUIT PATTERN OPERATION 2924, flow moves to a REMOVE DIE ATTACH ADHESIVE OPERATION 2926. In REMOVE DIE ATTACH ADHESIVE OPERATION 2926, die attach adhesive 3244 is removed above bond pads 3250 of integrated circuit die 3242, e.g., using laser-ablation. Integrated circuit die 3242 is encapsulated within and supported by dielectric material 616A. Removal of die attach adhesive 3244 exposes bond pads 3250 for subsequent attachment of bondwires thereto as discussed further below. Although die attach adhesive 3244 is illustrated as being removed only above bond pads 3250, in another embodiment, die attach adhesive 3244 is blanket removed.

From REMOVE DIE ATTACH ADHESIVE OPERATION 2926, flow moves, optionally, to BLANKET OR SELECTIVELY ETCH REMOVE ETCH STOP LAYER OPERATION 122A during which patterned etch stop layer 410 is blanket or selectively etched as discussed above.

From BLANKET OR SELECTIVELY ETCH REMOVE ETCH STOP LAYER OPERATION 122A (or directly from REMOVE DIE ATTACH ADHESIVE OPERATION 2926 in the event BLANKET OR SELECTIVELY ETCH REMOVE ETCH STOP LAYER OPERATION 122A is not performed), flow moves, optionally, to an APPLY WIREBOND PROMOTER OPERATION 2928. In APPLY WIREBOND PROMOTER OPERATION 2928, a wirebond promoter 3954, e.g., gold or organic solderability protectant (OSP), is applied to patterned etch stop layer 410, patterned conductor layer 412, and/or bond pads 3250, or portions thereof. Wirebond promoter 3954 enhances the wirebond connection between a bondwire, sometimes called wirebond, and the electrically conductive structure the bondwire is being attached to.

From APPLY WIREBOND PROMOTER OPERATION 2928 (or directly from OPERATION 122A in the event OPERATION 2928 is not performed or directly from OPERATION 2926 in the event OPERATIONS 122A, 2928 are not performed), flow moves to a WIREBOND OPERATION 2930. In WIREBOND OPERATION 2930, bondwires 3956 are formed to electrically connect bond pads 3250 to patterned conductor layer 412. As used herein, an external structure such as a bond wire or interconnection ball can be electrically connected to a patterned conductor layer directly, i.e., without any intervening conductor, or indirectly, e.g., through an etch stop layer.

From WIREBOND OPERATION 2930, flow moves optionally to FORM INTERCONNECTION BALLS OPERATION 124A, which is performed as discussed above. Illustratively, interconnection balls are formed on circuit pattern 3852.

From FORM INTERCONNECTION BALLS OPERATION 124A (or directly from WIREBOND OPERATION 2930 in the event FORM INTERCONNECTION BALLS OPERATION 124A is not performed), flow moves to and exits at an EXIT OPERATION 126A.

Although chip in substrate metal etch stop method 2900 includes FORM CIRCUIT PATTERN OPERATION 2924, in accordance with another embodiment, an etch stop metal protected circuit pattern carrier structure similar to etch stop metal protected circuit pattern carrier structure 1818A of FIG. 19 can be laminated during DIELECTRIC LAMINATION OPERATION 114A and processed accordingly.

Figure 40:
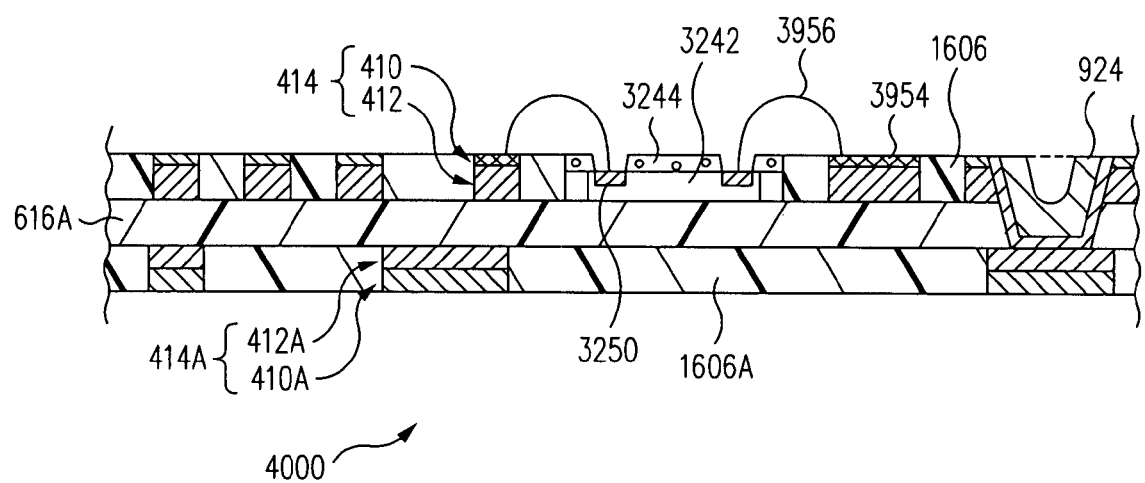
FIG. 40 is a cross-sectional view of a package in accordance with another embodiment of the present invention.

Such a structure is illustrated in FIG. 40, which is a cross-sectional view of a package 4000 in accordance with one embodiment. Package 4000 of FIG. 40 is similar to package 3000 of FIG. 39 and only the significant differences between packages 3000 and 4000 are discussed here. In package 4000, vias 924 electrically connect patterned conductor layer 412 with a lower etch stop metal protected circuit pattern 414A formed within a patterned dielectric layer 1606A. Etch stop metal protected circuit pattern 414A includes patterned etch stop layer 410A and a patterned conductor layer 412A.

Figure 41:
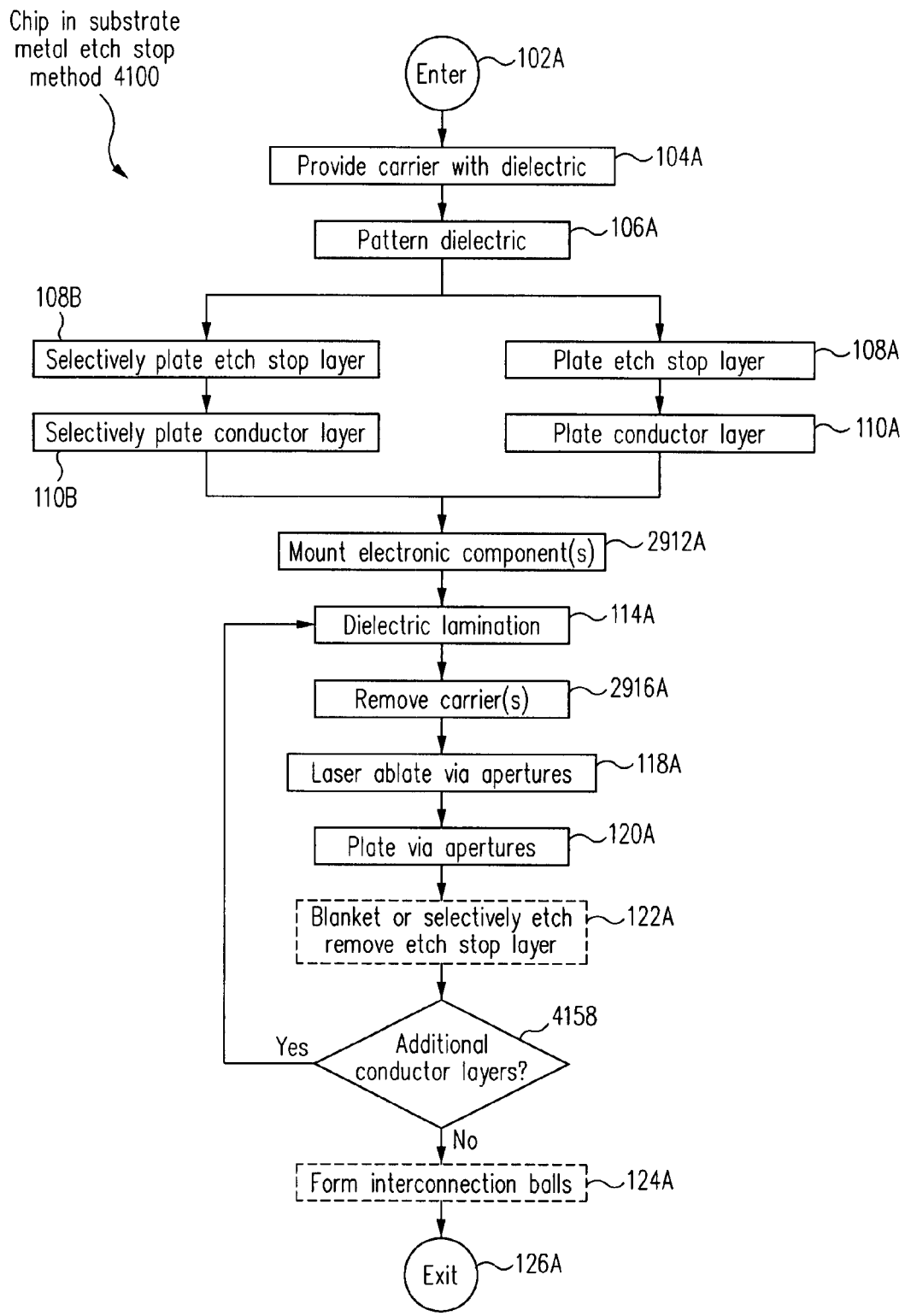
FIG. 41 is a chip in substrate metal etch stop method for fabricating an electronic component package in accordance with another embodiment of the present invention.
Figure 42:
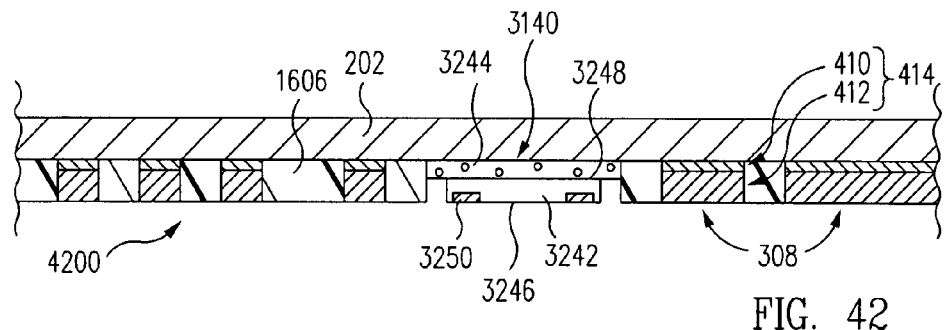
FIG. 42 is a cross-sectional view of a package during fabrication in accordance with one embodiment.

FIG. 41 is a chip in substrate metal etch stop method 4100 for fabricating an electronic component package in accordance with another embodiment of the present invention. FIG. 42 is a cross-sectional view of a package 4200 during fabrication in accordance with one embodiment. FIGS. 43, 44, 45, 46, 47, 48, 49, and 50 are cross-sectional views of package 4200 of FIG. 42 at various stages during fabrication in accordance with various embodiments of the present invention.

Chip in substrate metal etch stop method 4100 of FIG. 41 is similar to chip in substrate metal etch stop method 2900 of FIG. 29 and only the significant differences are discussed below. More particularly, OPERATIONS 102A, 104A, 106A, 108B, 110B, 2912A, 114A, 2916A, 118B, 120A, 122A, 124A, and 126A of FIG. 41 are similar or identical to OPERATIONS 102A, 104A, 106A, 108B, 110B, 2912, 114A, 2916, 118A, 120A, 122A, 124A, and 126A of FIG. 29, respectively, and only the significant differences between the operations are discussed below.

Referring now to FIGS. 41 and 42 together, from ENTER OPERATION 102A, flow moves to PROVIDE CARRIER WITH DIELECTRIC OPERATION 104A. In PROVIDE CARRIER WITH DIELECTRIC OPERATION 104A, carrier 202 is provided with a dielectric layer in a manner similar to that illustrated in FIG. 30.

From PROVIDE CARRIER WITH DIELECTRIC OPERATION 104A, flow moves to PATTERN DIELECTRIC OPERATION 106A. In PATTERN DIELECTRIC OPERATION 106A, the dielectric layer is patterned to form a patterned dielectric layer 1606.

More particularly, patterned dielectric layer 1606 includes circuit pattern artifacts 308 and electronic component opening 3140.

From PATTERN DIELECTRIC OPERATION 106A, flow moves to SELECTIVELY PLATE ETCH STOP LAYER OPERATION 108B. In SELECTIVELY PLATE ETCH STOP LAYER OPERATION 108B, patterned etch stop layer 410 is plated in circuit pattern artifacts 308 but not in electronic component opening 3140.

From SELECTIVELY PLATE ETCH STOP LAYER OPERATION 108B, flow moves to SELECTIVELY PLATE CONDUCTOR LAYER OPERATION 110B. In SELECTIVELY PLATE CONDUCTOR LAYER OPERATION 110B, patterned conductor layer 412 is plated in circuit pattern artifacts 308 but not in electronic component opening 3140.

From SELECTIVELY PLATE CONDUCTOR LAYER OPERATION 110B, flow moves to a MOUNT ELECTRONIC COMPONENT(S) OPERATION 2912A. In MOUNT ELECTRONIC COMPONENT(S) OPERATION 2912A, integrated circuit die 3242 is mounted within electronic component opening 3140 with die attach adhesive 3244. In accordance with this embodiment, inactive surface 3248 of integrated circuit die 3242 is mounted to carrier 202 by die attach adhesive 3244.

Figure 43:
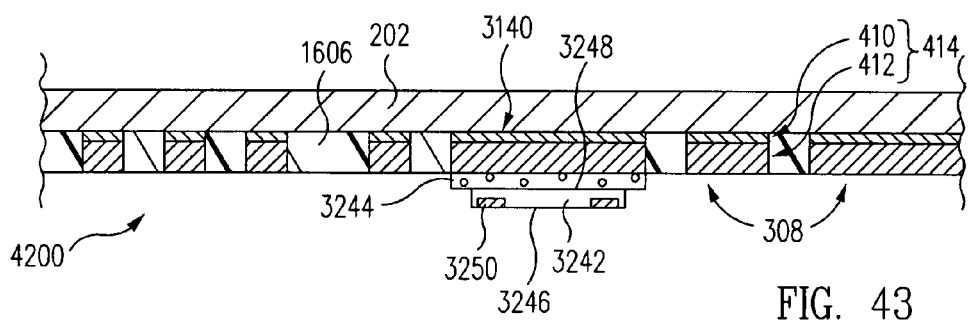
FIGS. 43, 44, 45, 46, 47, 48, 49, and 50 are cross-sectional views of the package of FIG. 42 at various stages during fabrication in accordance with various embodiments of the present invention.

Returning again to PATTERN DIELECTRIC OPERATION 106A, in another embodiment, instead of flow moving to SELECTIVELY PLATE ETCH STOP LAYER OPERATION 108B, flow moves to PLATE ETCH STOP LAYER OPERATION 108A. Referring now to FIGS. 41 and 43 together, in PLATE ETCH STOP LAYER OPERATION 108A, patterned etch stop layer 410 is blanket plated in circuit pattern artifacts 308 and in electronic component opening 3140.

From PLATE ETCH STOP LAYER OPERATION 108, flow moves to PLATE CONDUCTOR LAYER OPERATION 110A. In PLATE CONDUCTOR LAYER OPERATION 110A, patterned conductor layer 412 is blanket plated in circuit pattern artifacts 308 and in electronic component opening 3140.

From PLATE CONDUCTOR LAYER OPERATION 110A, flow moves to a MOUNT ELECTRONIC COMPONENT(S) OPERATION 2912A. In MOUNT ELECTRONIC COMPONENT(S) OPERATION 2912A, inactive surface 3248 of integrated circuit die 3242 is mounted to the portion of patterned conductor layer 412 in electronic component opening 3140 with die attach adhesive 3244. Accordingly, integrated circuit die 3242 is mounted outside of patterned dielectric layer 1606.

In FIGS. 44, 45, 46, 47, 48, 49 and 50, integrated circuit die 3242 is illustrated as being mounted within electronic component opening 3140 in accordance with the embodiment illustrated in FIG. 42. However, in light of this disclosure, it is to be understood that the discussion is equally applicable to the embodiment illustrated in FIG. 43 in which integrated circuit die 3242 is mounted to the portion of patterned conductor layer 412 in electronic component opening 3140.

Figure 44:
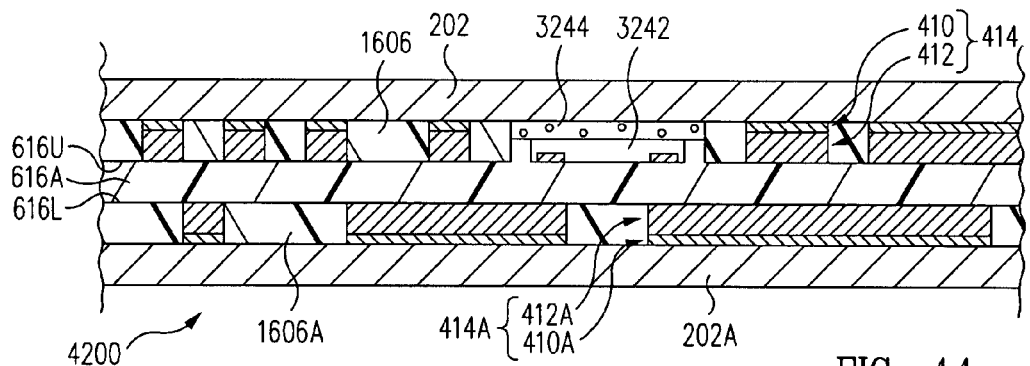

Referring now to FIGS. 41 and 44 together, from MOUNT ELECTRONIC COMPONENT(S) OPERATION 2912A, flow moves to DIELECTRIC LAMINATION OPERATION 114A. In DIELECTRIC LAMINATION OPERATION 114A, etch stop metal protected circuit pattern 414 is laminated to a dielectric material 616A.

More particularly, as shown in FIG. 44, etch stop metal protected circuit pattern 414 of FIG. 42 is laminated to upper surface 616U of dielectric material 616A. Dielectric material 616A flows around integrated circuit die 3242.

Further, a lower etch stop metal protected circuit pattern 414A is laminated into a lower, e.g., second, surface 616L of dielectric material 616A in a manner similar to that discussed above in regards to FIGS. 15 and 19, so is only briefly repeated here.

Second etch stop metal protected circuit pattern 414A is on a carrier 202A and within a patterned dielectric layer 1606A. Second etch stop metal protected circuit pattern 414A includes a patterned etch stop layer 410A and a patterned conductor layer 412A.

Figure 45:
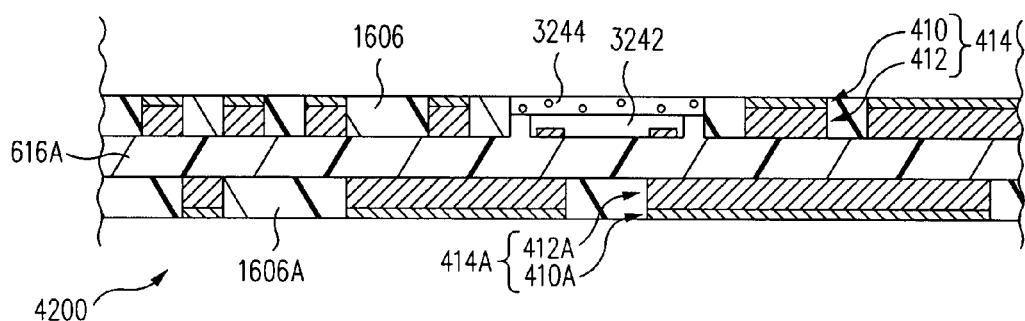

Referring now to FIGS. 41, 44 and 45 together, from DIELECTRIC LAMINATION OPERATION 114A, flow moves to REMOVE CARRIER(S) OPERATION 2916A. In REMOVE CARRIER(S) OPERATION 2916A, carriers 202, 202A are removed.

Figure 46:
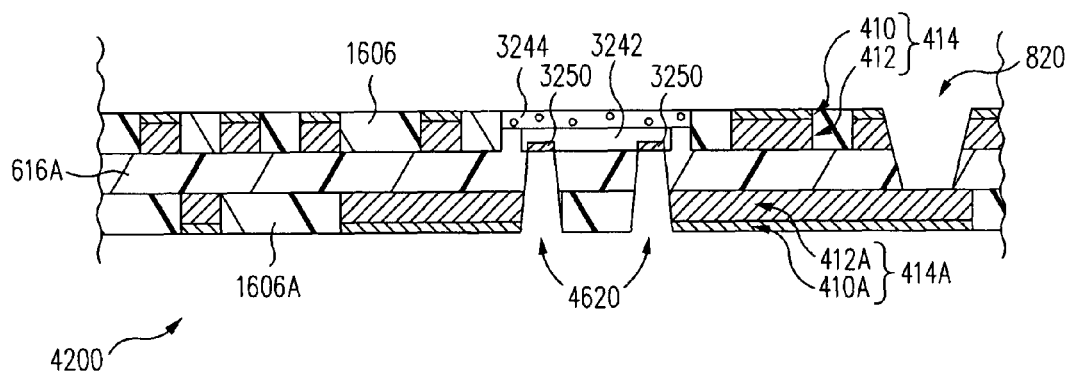

Referring now to FIGS. 41 and 46 together, from REMOVE CARRIER(S) OPERATION 2916A, flow moves to LASER-ABLATE VIA APERTURES OPERATION 118B. In LASER-ABLATE VIA APERTURES OPERATION 118B, via apertures 820 and bond pad via apertures 4620 are formed using laser-ablation. Bond pad via apertures 4620 extend through patterned dielectric layer 1606A and dielectric material 616A and to bond pads 3250 of integrated circuit die 3242. Generally, bond pad via apertures 4620 are formed to expose bond pads 3250 of integrated circuit die 3242 facilitating an electrical connection with bond pads 3250 as discussed further below.

Figure 47:
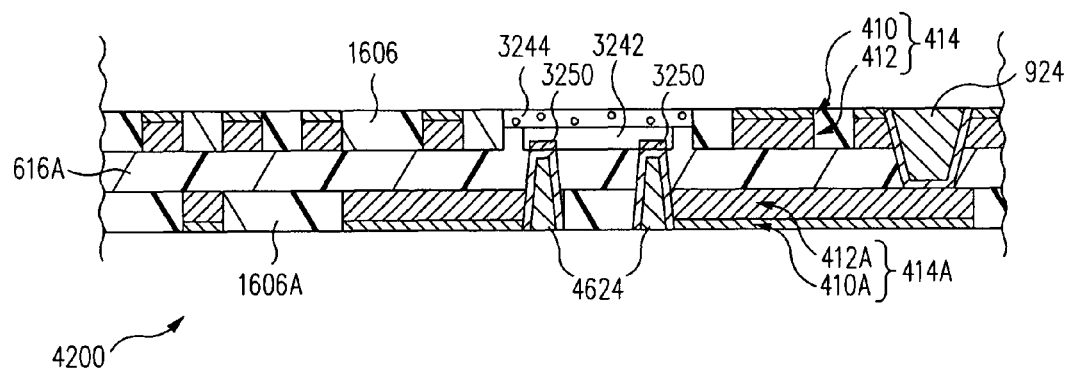

Referring now to FIGS. 41 and 47 together, from LASER-ABLATE VIA APERTURES OPERATION 118B, flow moves to PLATE VIA APERTURES OPERATION 120A. In PLATE VIA APERTURES OPERATION 120A, via apertures 820 and bond pad via apertures 4620 are plated, e.g., with copper or other conductive material in a manner similar to that discussed above. Accordingly, PLATE VIA APERTURES OPERATION 120A forms vias 924 electrically connecting patterned conductor layers 412, 412A and bond pad vias 4624 electrically connecting bond pads 3250 to patterned conductor layer 412A.

Figure 48:
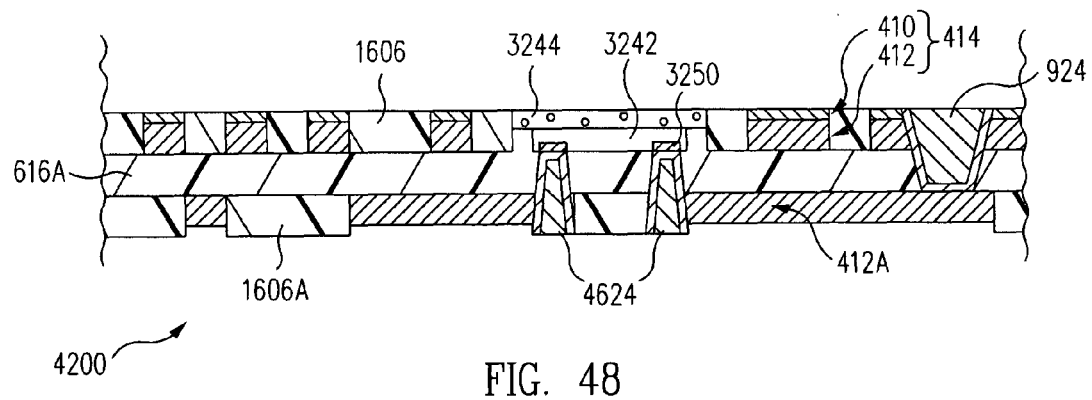

Referring now to FIGS. 41 and 48 together, from PLATE VIA APERTURES OPERATION 120A, flow moves, optionally, to BLANKET OR SELECTIVELY ETCH REMOVE ETCH STOP LAYER OPERATION 122A. In BLANKET OR SELECTIVELY ETCH REMOVE ETCH STOP LAYER OPERATION 122A, patterned etch stop layers 410 and/or 410A are blanket removed, i.e., entirely and non-selectively removed, or selectively removed, i.e., partially removed. In accordance with this embodiment, etch stop layer 410A is blanket removed.

Figure 49:
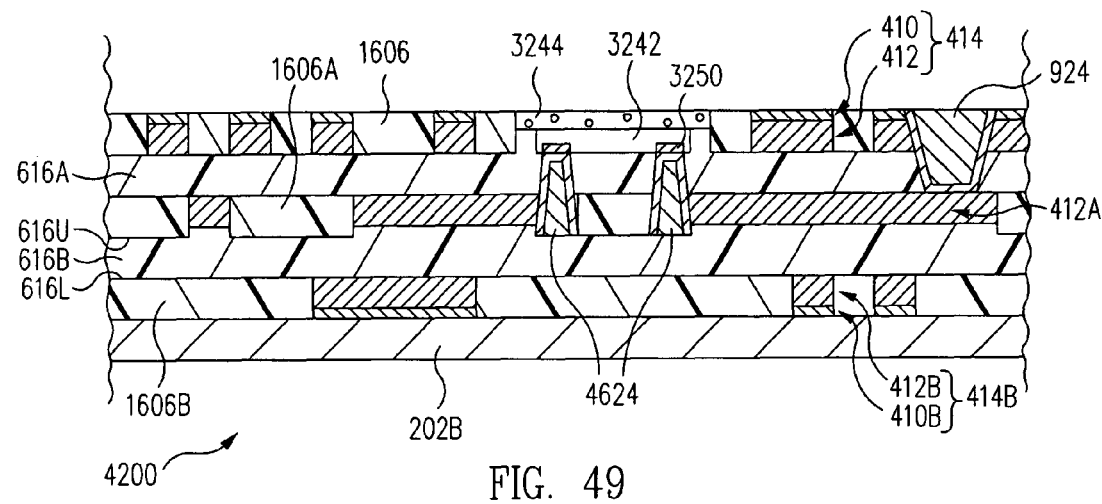

Referring now to FIGS. 41 and 49 together, from BLANKET OR SELECTIVELY ETCH REMOVE ETCH STOP LAYER OPERATION 122A (or directly from PLATE VIA APERTURES OPERATION 120A in the event that BLANKET OR SELECTIVELY ETCH REMOVE ETCH STOP LAYER OPERATION 122A is not performed), flow moves to an ADDITIONAL CONDUCTOR LAYERS CHECK OPERATION 4158. In ADDITIONAL CONDUCTOR LAYERS CHECK OPERATION 4158, a determination is made as to whether additional conductor layers are to be built up on package 4200. If additional conductor layers are to be built up on package 4200, flow returns to DIELECTRIC LAMINATION OPERATION 114A. Conversely, if additional conductor layers are not to be built up on package 4200, flow moves, optionally, to FORM INTERCONNECTION BALLS OPERATION 124A (or directly to EXIT OPERATION 126A in the event that FORM INTERCONNECTION BALLS OPERATION 124A is not performed).

In accordance with this embodiment, a determination is made that additional conductor layers are to be built up and flow returns to DIELECTRIC LAMINATION OPERATION 114A. In DIELECTRIC LAMINATION OPERATION 114A, an upper surface 616U of a dielectric material 616B is laminated to patterned dielectric layer 1606A and patterned conductor layer 412A. Further, a lower etch stop metal protected circuit pattern 414B is laminated into a lower surface 616L of dielectric material 616B in a manner similar to that discussed above in regards to FIGS. 15 and 19, so is only briefly repeated here.

The third etch stop metal protected circuit pattern 414B is on a carrier 202B and within a patterned dielectric layer 1606B. Third etch stop metal protected circuit pattern 414B includes a patterned etch stop layer 410B and a patterned conductor layer 412B.

Figure 50:
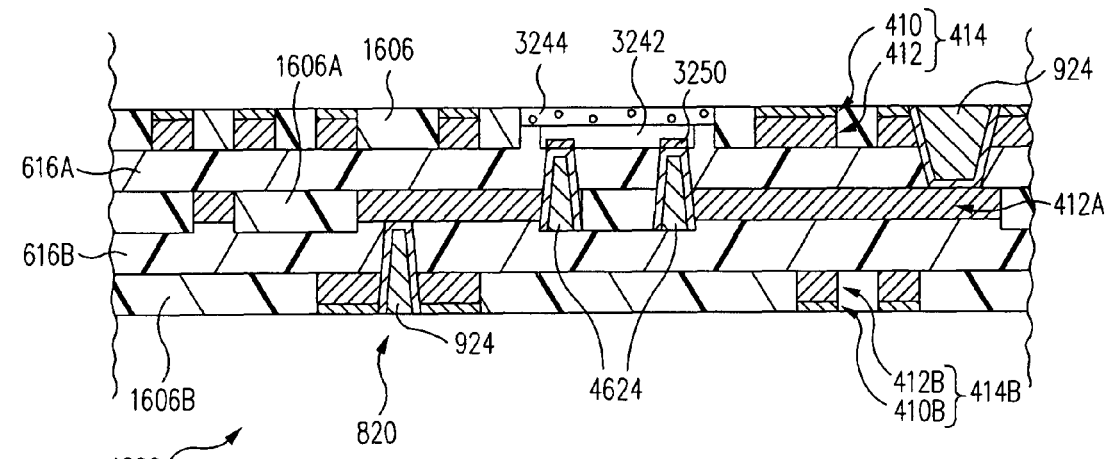

Referring now to FIGS. 41, 49 and 50 together, from DIELECTRIC LAMINATION OPERATION 114A, flow moves to REMOVE CARRIER(S) OPERATION 2916A. In REMOVE CARRIER(S) OPERATION 2916A, carrier 202B is removed.

Referring now to FIGS. 41 and 50 together, from REMOVE CARRIER(S) OPERATION 2916A, flow moves to LASER-ABLATE VIA APERTURES OPERATION 118B. In LASER-ABLATE VIA APERTURES OPERATION 118B, via apertures 820 are formed using laser-ablation. Via apertures 820 extend between patterned conductor layers 412A, 412B.

From LASER-ABLATE VIA APERTURES OPERATION 118B, flow moves to PLATE VIA APERTURES OPERATION 120A. In PLATE VIA APERTURES OPERATION 120A, via apertures 820 are plated, e.g., with copper or other conductive material in a manner similar to that discussed above. Accordingly, PLATE VIA APERTURES OPERATION 120A forms vias 924 electrically connecting patterned conductor layers 412A, 412B.

From PLATE VIA APERTURES OPERATION 120A, flow moves, optionally, to BLANKET OR SELECTIVELY ETCH REMOVE ETCH STOP LAYER OPERATION 122A. In BLANKET OR SELECTIVELY ETCH REMOVE ETCH STOP LAYER OPERATION 122A, patterned etch stop layers 410 and/or 410B are blanket removed, i.e., entirely and non-selectively removed, or selectively removed, i.e., partially removed.

From BLANKET OR SELECTIVELY ETCH REMOVE ETCH STOP LAYER OPERATION 122A (or directly from PLATE VIA APERTURES OPERATION 120A in the event that BLANKET OR SELECTIVELY ETCH REMOVE ETCH STOP LAYER OPERATION 122A is not performed), flow moves to ADDITIONAL CONDUCTOR LAYERS CHECK OPERATION 4158. In ADDITIONAL CONDUCTOR LAYERS CHECK OPERATION 4158, a determination is made that additional conductor layers are not to be built up on package 4200, and flow moves, optionally, to FORM INTERCONNECTION BALLS OPERATION 124A (or directly to EXIT OPERATION 126A in the event to FORM INTERCONNECTION BALLS OPERATION 124A is not performed).

In FORM INTERCONNECTION BALLS OPERATION 124A, interconnection balls are formed, e.g., on patterned conductor layers 412 and/or 412B. From FORM INTERCONNECTION BALLS OPERATION 124A, flow moves to and exits at EXIT OPERATION 126A.

Although methods 100, 100A, 2900, 4100 are set forth above as having particular operations, in light of this disclosure, those of skill in the art will recognize that the various operations set forth herein can be combined in other combinations to create substrates and/or packages in accordance with other embodiments.

This application is related to Huemoeller et al., commonly assigned and co-filed U.S. patent application Ser. No. 11/765,806, entitled "METAL ETCH STOP FABRICATION METHOD AND STRUCTURE", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed:

1. A method of forming an electronic component package comprising:
    patterning a first dielectric layer on a first carrier to form a first patterned dielectric layer, the first patterned dielectric layer comprising circuit pattern artifacts and at least one electronic component opening;
    plating a first patterned etch stop layer on the first carrier and within the circuit pattern artifacts;
    plating a first patterned conductor layer on the first patterned etch stop layer and within the circuit pattern artifacts, wherein the first patterned etch stop layer and the first patterned conductor layer form a first etch stop metal protected circuit pattern, wherein an etch stop metal of the first patterned etch stop layer is selectively etchable compared to a conductor metal of the first patterned conductor layer; and
    mounting an active surface comprising bond pads of an electronic component to the first carrier in the electronic component opening with a die attach adhesive, the entire active surface being within the electronic component opening.

2. The method of claim 1 wherein the etch stop metal is selected from the group consisting of nickel, tin, gold, and palladium.

3. The method of claim 1 wherein the conductor metal is selected from the group consisting of copper; silver, and solder.

4. The method of claim 3 wherein the etch stop metal is selected from the group consisting of nickel, tin, gold, and palladium.

5. The method of claim 1 further comprising laminating the first etch stop metal protected circuit pattern to a second carrier with a dielectric material.

6. The method of claim 5 wherein during the laminating, the dielectric material flows to encapsulate the electronic component.

7. The method of claim 5 further comprising removing the first carrier.

8. The method of claim 7 further comprising forming via apertures through the dielectric material and to the second carrier.

9. The method of claim 8 further comprising removing the second carrier.

10. The method of claim 9 wherein the first etch stop metal protected circuit pattern is laminated to a first surface of the dielectric material, the method further comprising forming a circuit pattern on a second surface of the dielectric material.

11. The method of claim 10 further comprising removing the die attach material above the bond pads of the electronic component.

12. The method of claim 11 further comprising etch removing at least a portion of the first patterned etch stop layer.

13. The method of claim 11 further comprising applying a wirebond promoter to the first patterned conductor layer.

14. The method of claim 11 further comprising forming interconnection balls electrically connected to the first patterned conductor layer.

15. The method of claim 11 further comprising electrically connecting the bond pads to the first patterned conductor layer with bond wires.

* * * * *